(12) United States Patent
Ballantine et al.

(10) Patent No.: US 11,196,104 B2
(45) Date of Patent: Dec. 7, 2021

(54) BATTERY AS A SERVICE

(71) Applicant: BLOOM ENERGY CORPORATION, San Jose, CA (US)

(72) Inventors: Arne Ballantine, Palo Alto, CA (US); John Cronin, Jericho, VT (US); Joseph Bodkin, Williston, VT (US)

(73) Assignee: BLOOM ENERGY CORPORATION, San Jose, CA (US)

( * ) Notice: Subject to any disclaimer, the term of this patent is extended or adjusted under 35 U.S.C. 154(b) by 245 days.

(21) Appl. No.: 16/363,262

(22) Filed: Mar. 25, 2019

(65) Prior Publication Data

US 2019/0312317 A1    Oct. 10, 2019

Related U.S. Application Data

(60) Provisional application No. 62/647,302, filed on Mar. 23, 2018.

(51) Int. Cl.
*H01M 10/48* (2006.01)
*H01M 10/42* (2006.01)
*G01R 31/389* (2019.01)

(52) U.S. Cl.
CPC ......... *H01M 10/48* (2013.01); *H01M 10/425* (2013.01); *G01R 31/389* (2019.01); *H01M 2010/4271* (2013.01); *H01M 2010/4278* (2013.01)

(58) Field of Classification Search
CPC .... H01M 10/48; H01M 10/425; G01R 31/389
See application file for complete search history.

(56) References Cited

U.S. PATENT DOCUMENTS 9,267,997 B2 * 2/2016 Pisu ..................... H01M 10/42
9,461,319 B2 10/2016 Sudhan et al.
9,461,320 B2 10/2016 Ballantine et al.
(Continued)

OTHER PUBLICATIONS

U.S. Appl. No. 16/363,361, filed Mar. 25, 2019, Bloom Energy Corp.
(Continued)

*Primary Examiner* — Reena Aurora
(74) *Attorney, Agent, or Firm* — The Marbury Law Group PLLC

(57) ABSTRACT

Electrochemical impedance spectroscopy (EIS) may include testing various voltages and currents, storing and sending the data to an electrochemical impedance spectroscopy analyzer (EISA) network, where the data may be compared to historical data to determine a battery event as a user action recommendation may provide preferred operating use of a device battery in response correlation of EIS test results and comparison for similarities of EIS test results. Historical EIS test data may be stored in an EISA network with a server configured to receive EIS test results from battery-operated devices, correlate received EIS test data to historical EIS test data, and provide recommendations on battery use and/or maintenance to the battery-operated device based on the correlation results. Analyzing EIS test data and sending recommendations on battery use and/or maintenance service may be provided on a subscription basis.

18 Claims, 18 Drawing Sheets

(56) References Cited

U.S. PATENT DOCUMENTS

| | | |
|---|---|---|
| 10,386,422 B2 * | 8/2019 | Christensen ............ B60L 58/16 |
| 2015/0228990 A1 | 8/2015 | Ballantine et al. |
| 2015/0244011 A1 | 8/2015 | Sudhan et al. |
| 2017/0077535 A1 | 3/2017 | Sudhan et al. |

OTHER PUBLICATIONS

U.S. Appl. No. 16/363,160, filed Mar. 25, 2019, Bloom Energy Corporation.
U.S. Appl. No. 16/363,214, filed Mar. 25, 2019, Bloom Energy Corporation.
U.S. Appl. No. 16/363,435, filed Mar. 25, 2019, Bloom Energy Corporation.

* cited by examiner

| User ID | EISA Test Waveforms | Response Waveform | Waveform Result | Battery Event |
|---|---|---|---|---|
| UID1X23 | Sinusoid wave, 100 Hz | Sinusoid wave, 103 Hz | Within 5% Frequency Change | Battery Charging |
| UID1X23 | Sinusoid wave, 100 Hz | Sinusoid wave, 114 Hz | Outside 10 % Frequency Change | Battery Replacement |
| UID1X23 | Sinusoid Wave, 200 Hz | Sinusoid Wave, 208 Hz | Within 5% Frequency Change | Download Manufacturer Patch PC1234 |
| UID1X23 | Sinusoid Wave, 200 Hz | Sinusoid Wave, 245 Hz | Outside 10 % Frequency Change | Replace with 9 cell battery |
| ... | ... | ... | ... | ... |

FIG. 14

| User ID | EISA Input Waveforms | Output Waveform | Waveform Result | Battery Event | Correlation Coefficient <EISA Waveform, Battery Event> |
|---|---|---|---|---|---|
| UID1X23 | Sinusoid wave, 100 Hz | Sinusoid wave, 103 Hz | Within 5% Frequency Change | Battery Charging | 0.98 |
| UID2X24 | Sinusoid wave, 100 Hz | Sinusoid wave, 114 Hz | Outside 10 % Frequency Change | Battery Replacement | 0.87 |
| UID3X25 | Sinusoid Wave, 200 Hz | Sinusoid Wave, 208 Hz | Within 5% Frequency Change | Download Manufacturer Patch PC1234 | 0.69 |
| UID4X26 | Sinusoid Wave, 200 Hz | Sinusoid Wave, 245 Hz | Outside 10 % Frequency Change | Replace with 9 cell battery | 0.47 |
| UIDNNNN | ... | | | ... | ... |

| Test Database | | | |
|---|---|---|---|
| Battery Type | Battery ID | Test Waveform | Response Waveform |
| Li-ion, MNC | LiXXXX | Sinusoid, 100 Hz, 2mA | Response file 1. dat |
| Li-ion, MNC | LiXXXX | Sinusoid, 100 Hz, 2mA | Response file 2. dat |
| Pb Acid | PbAAA | Sinusoid, 200 Hz, 2mA | Response file 3. dat |
| Li-ion, LiFePO | LiUUUU | Sinusoid, 120 Hz, 2mA | Response file 4. dat |
| Ni-Cd | NI1233 | Sinusoid, 10 Hz, 2mA | Response file 5. dat |

| Command Database | | |
|---|---|---|
| Battery Type | Battery ID | Commands |
| Li-ion, MNC | LiXXXX | Apply input for 2 sec and take output for 3 sec |
| Li-ion, MNC | LiXXXX | Apply input for 2 sec and take output for 3 sec |
| Pb Acid | PbAAA | Apply input for 12 sec and take output for 20 sec |
| Li-ion, LiFePO | LiUUUU | Apply input for 5sec and take output for 10 sec |
| Ni-Cd | NI1233 | Apply input for 2 sec and take output for 2 sec |

BATTERY AS A SERVICE

CROSS REFERENCE TO RELATED APPLICATIONS

This application claims the benefit of priority to U.S. Provisional Patent Application Ser. No. 62/647,302 filed Mar. 23, 2018, entitled "Battery As A Service", the contents of which are incorporated herein by reference in their entirety.

BACKGROUND

Batteries may be susceptible to degradation from charging and discharging cycles because of the effects these factors may have on the internal chemistry of batteries. Battery degradation from charge and discharge cycles may be caused by adhesion of oxidized particles to an anode and a cathode reducing a surface area for reacting with an electrolyte, reducing an amount of the electrolyte in the battery, and increase an internal resistance of the battery. Battery degradation may result in a reduced power storage capacity, a reduced voltage output, and an increased self-discharge rate. These degradations of a battery's performance may also reduce a useful life of a battery.

SUMMARY

The systems, methods, and devices of the various embodiments enable improved battery longevity and performance based on analysis of electrochemical impedance spectroscopy ("EIS") performed on a battery and compare with historical data of EIS testing on batteries. In some embodiments, EIS testing may be associated with a battery event on a battery powered device. In some embodiments, results of EIS tests and historical results of EIS tests for batteries may be correlated to determine whether a battery event is correct or whether to suggest a new battery event. In some embodiments, results of EIS tests and historical results of EIS tests for batteries may be compared to determine similarities and to send the new battery event as a user action recommendation in response to determining similarities. In some embodiments, a user may be notified of the user action recommendation via a graphical user interface (GUI) of the battery powered device.

DESCRIPTION OF THE DRAWINGS

The accompanying drawings, which are incorporated herein and constitute part of this specification, illustrate example embodiments of various embodiments, and together with the general description given above and the detailed description given below, serve to explain the features of the claims.

FIG. 14 is a table illustrating an example user action database according to an embodiment.

FIG. 15 is a table illustrating an example battery use database according to an embodiment.

FIG. 16A is a table illustrating an example test database according to an embodiment.

FIG. 16B is a table illustrating an example command database according to an embodiment.

DETAILED DESCRIPTION

Figure 1:
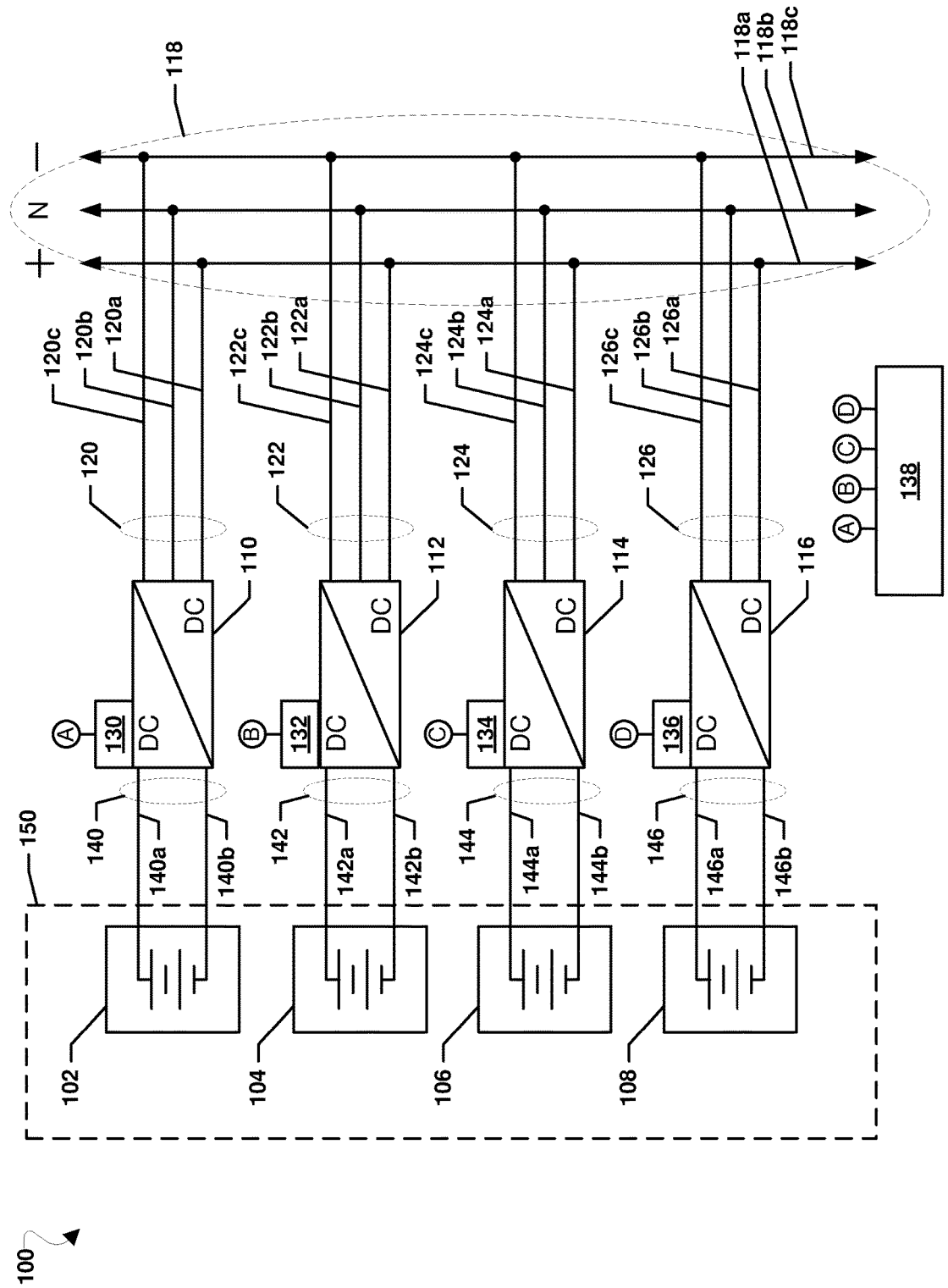
FIG. 1 is a block diagram illustrating a system according to an embodiment.

Various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Many types of batteries are susceptible to degradation from charging and discharging cycles, heat and cold exposure, and aging because of the effects these factors may have on the internal chemistry of batteries. For example, any one or combination of the battery degradation factors may result in deposits of oxidized particles of an electrolyte adhering to an anode and a cathode of a battery. The adhesion of the oxidized particles to the anode and the cathode may reduce a surface area of the anode and the cathode for reacting with the electrolyte, reduce an amount of electrolyte in the battery, and increase the internal resistance of the battery. Battery degradation may result in a reduced power storage capacity, a reduced voltage output, and an increased self-discharge rate. These degradations of a battery's performance may also reduce a useful life of a battery. In some embodiment, battery charging may be managed to improve efficiency, performance, and/or longevity of batteries.

The term "battery" may be used interchangeably herein to refer to a battery pack, which may include any number batteries, a battery, which may include any number of battery cells, and/or a battery cell of a battery. A battery may include any rechargeable wet cell battery, rechargeable dry cell battery, and/or rechargeable solid state battery.

The systems, methods, and devices of the various embodiments enable electrochemical impedance spectroscopy (EIS) (also called AC impedance spectroscopy) to be performed on batteries by power electronics connecting the batteries in parallel to a common load and/or bus.

EIS enables the overall impedance of a battery to be determined by applying a test waveform of varying voltage, varying current, or varying voltage and current to the battery and measuring a voltage or current across the battery at varying sampling frequencies to determine a response waveform of varying voltage, varying current, or varying voltage and current. A testing waveform of varying voltage, varying current, or varying voltage and current may be selected to achieve the varying sampling frequencies, such as a waveform with voltage/current oscillations of approximately 1 Hz, may be generated on a line connected to the battery. Such a voltage/current waveform may be generated by rapid switching of the line to load and unload the battery, thereby injecting the test waveform into the battery. The testing waveform may be a sine wave or other type pattern of variation with time of voltage, current or voltage and current, and may be selected to achieve desired sampling frequencies for a particular EIS test. A voltage or current of the battery and a resulting phase angle may be measured or determined at a sampling frequency to obtain a response waveform, and the response waveform or the resulting measurements/determinations processed using EIS to determine battery impedances. During EIS testing, a number of different voltage/current waveforms may be applied to the battery to obtain different response waveforms, such as impedance measured at various applied waveform frequencies. For ease of reference, a waveform of varying voltage, varying current, or varying voltage and current applied to the battery is referred to herein and in the claims as a "test waveform" to encompass applied voltage, current and voltage/current waveforms. For ease of reference, measurements of voltage, current or voltage and current across the battery while a testing waveform is applied are referred generally and collectively in the specification and the claims as a "response waveform." By comparing the applied testing waveform to the measured or determined response waveform, an impedance response of the battery may be determined at the frequency of the applied testing waveform.

Results of the EIS procedure (e.g., the impedance at varying frequencies) may be graphically represented using a Nyquist plot or Bode plot and characteristics of the battery may be determined based on the impedance response of the battery. By comparing the impedance response of the battery being measured to known signatures of impedance responses of batteries with known characteristics, the characteristics of the measured battery may be identified. Characteristics of the battery that may be determined based at least in part on the impedance response include charge conditions (e.g., state of charge), anode conditions, and cathode conditions. Based on the determined characteristics of the battery, a setting of the electrochemical device may be adjusted. Additionally, determined characteristics of the battery may be compared to a failure threshold, and when the characteristics exceed the failure threshold, a failure mode of the battery may be indicated, such as buildup of non-conductive compounds on the anode or cathode, dendritic breakdown of the electrolyte, etc.

In an embodiment, correlations of impedance responses of various types of batteries to various battery events, charge state, and/or various failure modes may be discovered by collecting in data sets the impedance responses (i.e., EIS data) of various batteries performed by electrochemical impedance spectroscopy analyzer (EISA) systems on battery-powered devices along with indications of battery events, charge state, and/or failure modes, and then using such data sets to train a learning algorithm, an artificial intelligence (AI), neural network model or other inference engine to create a battery use database (i.e., an EIS database) correlating EIS test results to battery events or conditions and recommendations for responding to such events or conditions. In some embodiments, such a battery use database may comprise stored plots of impedance responses and/or stored impedance values of similar batteries correlated with known characteristics. By collecting data from many batteries operating under different operating conditions and charging/discharging profiles, a battery use database of battery characteristics can be created that may be generally useful by an EISA for monitoring or diagnosing battery systems encompassing a wide range of battery applications. A battery use database may be created for each of a variety of battery types. Further, the process of collecting information on impedance responses of batteries and battery events, charge state, and/or failure modes for various types of batteries using such data sets to train a learning algorithm may be performed continuously or periodically so as to refine the battery use databases over time. The collection of battery impedance responses (i.e., EIS data), battery events, charge state, and failure mode and the creation and refinement of battery use databases may be performed in a centralized service, such as an EISA network. Once the battery use databases are generated, the EISA network can leverage the knowledge within such databases to provide a battery management service to subscribing or purchasing battery-powered devices by using a learning algorithm, AI engine or neural network model identify appropriate recommendations for device users appropriate for received EIS test data. In some embodiments, such an EISA network and the battery management service provided by that network may be cloud-based.

In an embodiment, the power electronics connected to each battery of a group of two or more batteries may compensate for any ripple generated during EIS such that no ripple or a reduced ripple is realized at the common load and/or bus. As one power electronics injects the test waveform into its respective battery, a resulting ripple from that power electronics may be applied to the load and/or bus. To counteract this ripple from the power electronics performing EIS monitoring, an offsetting (or canceling) ripple or ripples may be generated by one or more of the other power electronics. To generate the offsetting (or canceling) ripple or ripples one or more of the other power electronics not presently performing EIS monitoring may inject an offset waveform toward their respective battery resulting in an offsetting ripple being applied to the common load and/or bus connected in parallel to the batteries. The sum of the ripple from the power electronics performing EIS monitoring and the offsetting ripple or ripples from the one or more other power electronics may be a DC output resulting in no ripple at the load and/or common bus.

In another embodiment, other devices connected to the common load and/or bus may compensate for any ripple generated during EIS such that no ripple or a reduced ripple is realized at the common load and/or bus. As discussed above, as one power electronics injects the test waveform into its respective battery, a resulting ripple from that power electronics may be applied to the load and/or bus. To counteract this ripple from the power electronics performing EIS monitoring, an offsetting (or canceling) ripple or ripples may be generated by one or more other device, such as a waveform generator, and injected into the common load and/or bus. To generate the offsetting (or canceling) ripple or ripples one or more other device may apply an offset ripple to the common load and/or bus connected in parallel to the batteries. The sum of the ripple from the power electronics performing EIS monitoring and the offsetting ripple or ripples applied by the other device may be a DC output resulting in no ripple at the load and/or common bus.

In an embodiment, during EIS monitoring the impedance of a battery may be determined as the polar form voltage of the battery over the polar form current of the battery. This may enable a Fourier series calculation to be used to allow for analysis of an imperfect sinusoidal ripple at the fundamental frequency without needing to calculate a full Fast Fourier Transform. This may increase the accuracy of the impedance calculation and decrease the processing time required to determine an impedance response in comparison to impedance determinations made using a full Fast Fourier Transform.

In an embodiment, energy storage devices may be included on the power electronics connected to each battery. Energy storage devices may be any type energy storage devices, such as capacitors, supercapacitors, batteries, etc. In various embodiments, the energy storage devices may be on the output, the input, or windings of the transformer of the power electronics to store ripple energy and discharge the ripple energy out of phase. The energy storage device may reduce the ripple current, or eliminate the ripple current, passing to the bus. The ability to reduce and/or eliminate the ripple current resulting from EIS testing may enable EIS testing using test waveforms with higher frequencies than may be used without the energy storage devices. For example, test waveforms with frequencies at or above 400 Hz may be used, greatly extending the bandwidth of the power electronics to create and analyze test waveforms. Without the energy storage devices, the bandwidth of the test waveform frequencies may be practically limited to frequencies less than the switching frequency of the power electronics. With the energy storage devices, the bandwidth of the test waveform frequencies may extend to frequencies greater than the switching frequency of the power electronics.

FIG. 1 is a block diagram of a system 100 according to an embodiment. The system 100 may include any number of batteries 102, 104, 106, and 108. For example, the batteries 102, 104, 106, and 108 may each be batteries that may constitute a portion of a power module 150. Each battery 102, 104, 106, and 108 may be electrically connected via a respective input connection 140, 142, 144, and 146 to a respective one of power electronics 110, 112, 114, and 116. Each input connection 140, 142, 144, and 146 may comprise a respective positive input connection 140a, 142a, 144a, and 146a as well as a respective negative input connection 140b, 142b, 144b, and 146b. In operation, the batteries 102, 104, 106, and 108 may output DC voltages to their respective power electronics 110, 112, 114, and 116 via their respective input connections 140, 142, 144, and 146.

The power electronics 110, 112, 114, and 116 may be DC to DC converters. The power electronics 110, 112, 114, and 116 may be each include controllers 130, 132, 134, and 136, respectively, each connected, wired or wirelessly, to a central controller 138. The controllers 130, 132, 134, and 136 may be processors configured with processor-executable instructions to perform operations to control their respective power electronics 110, 112, 114, and 116, and the controller 138 may be a processor configured with processor-executable instructions to perform operations to exchange data with and control the operations of power electronics 110, 112, 114, and 116 via their respective controllers 130, 132, 134, and 136. Via the connections A, B, C, and D between the controllers 130, 132, 134, and 136 connected to the power electronics 110, 112, 114, and 116 and the controller 138, the controller 138 may be effectively connected to the power electronics 110, 112, 114, and 116 and control the operations of the power electronics 110, 112, 114, and 116.

The power electronics 110, 112, 114, and 116 may be connected in parallel to a DC bus 118 by their respective output connections 120, 122, 124, and 126. In an embodiment, the DC bus 118 may be a three phase bus comprised of a positive line 118a, a neutral line 118b, and a negative line 118c, and the respective output connections 120, 122, 124, and 126 may include respective positive output connections 120a, 122a, 124a, and 126a, respective neutral output connections 120b, 122b, 124b, and 126b, and respective negative output connections 120c, 122c, 124c, and 126c. In operation, the power electronics 110, 112, 114, and 116 may output DC voltages to the bus 118 via their respective output connections 120, 122, 124, and 126. In an embodiment, power electronics 110, 112, 114, and 116 may be three phase converters configured to receive positive and negative DC inputs from their respective batteries 102, 104, 106, and 108 and output positive DC, negative DC, and neutral outputs to the bus 118 via their respective positive output connections 120a, 122a, 124a, and 126a, respective neutral output connections 120b, 122b, 124b, and 126b, and respective negative output connections 120c, 122c, 124c, and 126c. In an alternative embodiment, power electronics 110, 112, 114, and 116 may each be comprised of dual two-phase converters. The positive output of the first of the two-phase converters may be connected to the positive line 118a of the bus 118 and the negative output of the second of the two-phase converters may be connected to the negative line 118c of the bus 118. The negative output of the first of the two-phase converters and the positive output of the second of the two-phase converters may be connected together to the neutral line 118b of the bus 118.

In an embodiment, the power electronics 110, 112, 114, and 116 may each be configured to perform EIS monitoring of their respective battery 102, 104, 106, and 108. The controller 138 may select a test waveform for use in EIS monitoring for one of the batteries 102, 104, 106, or 108, and may control that power electronics 110, 112, 114, or 116 of that battery 102, 104, 106, or 108 to inject the selected test waveform onto the respective input connection 140, 142, 144, or 146. For example, the controller 138 may send an indication of the selected test waveform to the controller 130 of power electronics 110 to cause opening and closing of a switch at the power electronics 110 to generate the selected test waveform via pulse width modulation on the input connection 140 of connected to the battery 102. The power electronics 110, 112, 114, or 116 injecting the test waveform may be configured to monitor the resulting impedance response of its respective battery 102, 104, 106, or 108, and via its respective controller 130, 132, 134, or 136 may output an indication of the monitored impedance response to the controller 138. Continuing with the preceding example, power electronics 110 may monitor the impedance response on the input connection 140 to the battery 102 and the controller 130 may indicate the impedance response of battery 102 to the controller 138.

The controller 138 may use the impedance response determined by EIS monitoring of a battery 102, 104, 106, 108 to determine a characteristic of that battery 102, 104, 106, 108 and may adjust a setting of the system 100 based on the determined characteristic. For example, the controller 138 may determine the impedance response according to method 500 described further below with reference to FIG. 5. The controller 138 may compare the impedance response determined by EIS monitoring of a battery 102, 104, 106, 108, such as a plot of the impedance response and/or stored impedance values, to impedance responses stored in a memory, such as stored plots of impedance responses and/or stored impedance values, of similar batteries correlated with known characteristics. The controller 138 may compare the impedance response determined by EIS monitoring of a battery 102, 104, 106, 108 to the stored impedance responses in any manner to identify matches between the impedance responses determined by EIS monitoring of a battery 102, 104, 106, 108 and the stored impedance responses.

When the controller 138 determines a match (e.g., identically or within some predetermined variance value) between the impedance response determined by EIS monitoring of a battery 102, 104, 106, 108 and a stored impedance response, the controller 138 may determine the characteristic correlated with the stored impedance response to be the characteristic of the respective battery 102, 104, 106, 108. For example, EIS monitoring may enable determined characteristics of the batteries 102, 104, 106, or 108 to be compared to charge state characteristics to determine an amount of charge stored in the batteries or whether charging of the batteries is indicated, and a suitable charging operation may be scheduled or commenced. As another example, EIS monitoring may enable determined characteristics of the batteries 102, 104, 106, or 108 to be compared to a failure threshold, and when the characteristics exceed the failure threshold a failure mode of the battery 102, 104, 106, or 108 may be indicated or determined, such as cathode or anode degradation, dendritic degradation of the electrolyte, chemical breakdown of the electrolyte, etc. Based on an indicated or determined failure mode, a suitable response may be indicated or taken, such as adjusting charging and discharging usage of one or more batteries 102, 104, 106, or 108 to extend the useful life of the power assembly 150, adjusting a charging rate and/or a discharging rate to slow or limit further battery degradation, performing a maintenance cycle on one or more of the batteries 102, 104, 106, or 108 (e.g., a deep discharge followed by full recharge), isolating one of the batteries 102, 104, 106, or 108 to prevent failure, and/or indicating that one or more batteries 102, 104, 106, or 108 are reaching end of life and should be replaced. Actions taken in response to an indicated or determined failure mode When a test waveform is injected on an input connection 140, 142, 144, or 146 by a respective power electronics 110, 112, 114, or 116 to perform EIS monitoring, a ripple on the respective output connection 120, 122, 124, or 126 may occur. If unaccounted for, the resulting ripple from the power electronics 110, 112, 114, or 116 performing EIS monitoring may cause an undesired ripple on the DC bus 118. To prevent a ripple on the DC bus 118, the ripple from the power electronics 110, 112, 114, or 116 performing EIS monitoring may be offset or canceled by other ripples injected into the DC bus 118. In an embodiment, the other ripples may be generated by one or more of the other power electronics 110, 112, 114, or 116 not performing EIS monitoring. The ripples from one or more of the other power electronics 110, 112, 114, or 116 not performing EIS monitoring may be generated by controlling the one or more of the other power electronics 110, 112, 114, or 116 not performing EIS monitoring to inject an offset waveform into their respective input connections to their respective input connections 140, 142, 144, or 146. The offset waveform or waveforms may be selected by the controller 138 such that the ripples on the respective output connections 120, 122, 124, or 126 generated in response to injecting the offset waveform or waveforms cancels the ripple caused by the power electronics 110, 112, 114, or 116 performing EIS monitoring when the waveforms are summed at the DC bus 118. In another embodiment, ripples may be injected into output connections 120, 122, 124, or 126 from devices other than the power electronics 110, 112, 114, or 116 to cancel the ripple caused by the power electronics 110, 112, 114, or 116 performing EIS monitoring when the waveforms are summed at the DC bus 118. For example, a waveform generator may be connected to output connections 120, 122, 124, or 126 to inject canceling ripples in response to EIS monitoring.

Figure 2A:
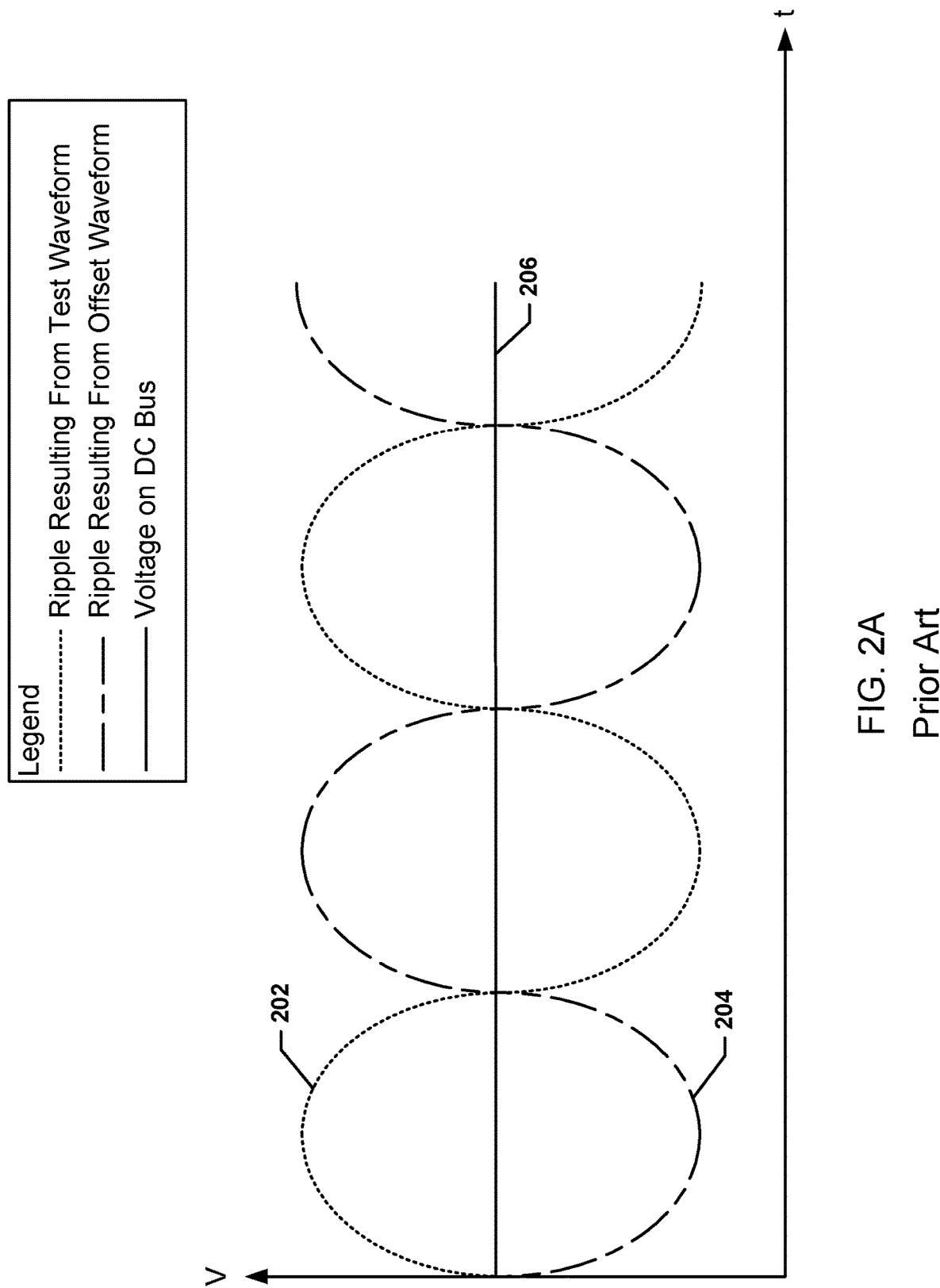
FIGS. 2A and 2B are graphs illustrating canceling ripples on a DC bus over time.

FIG. 2A is a graph illustrating canceling ripples on a DC bus over time. A test waveform injected onto an input connection of a battery by a power electronics may result in a ripple 202 sent from the power electronics injecting the test waveform toward a DC bus. An offset waveform injected onto an input connection of another battery by another power electronics may result in a ripple 204 sent from that power electronics injecting the offset waveform toward the DC bus. The offset waveform may be selected such that the ripple 204 is 180 degrees out of phase with the ripple 202. The power electronics may be connected to the DC bus in parallel and the sum of the ripple 202 and the ripple 204 may cancel each other out such that the sum of the waveforms is the desired DC voltage 206 on the DC bus.

Figure 2B:
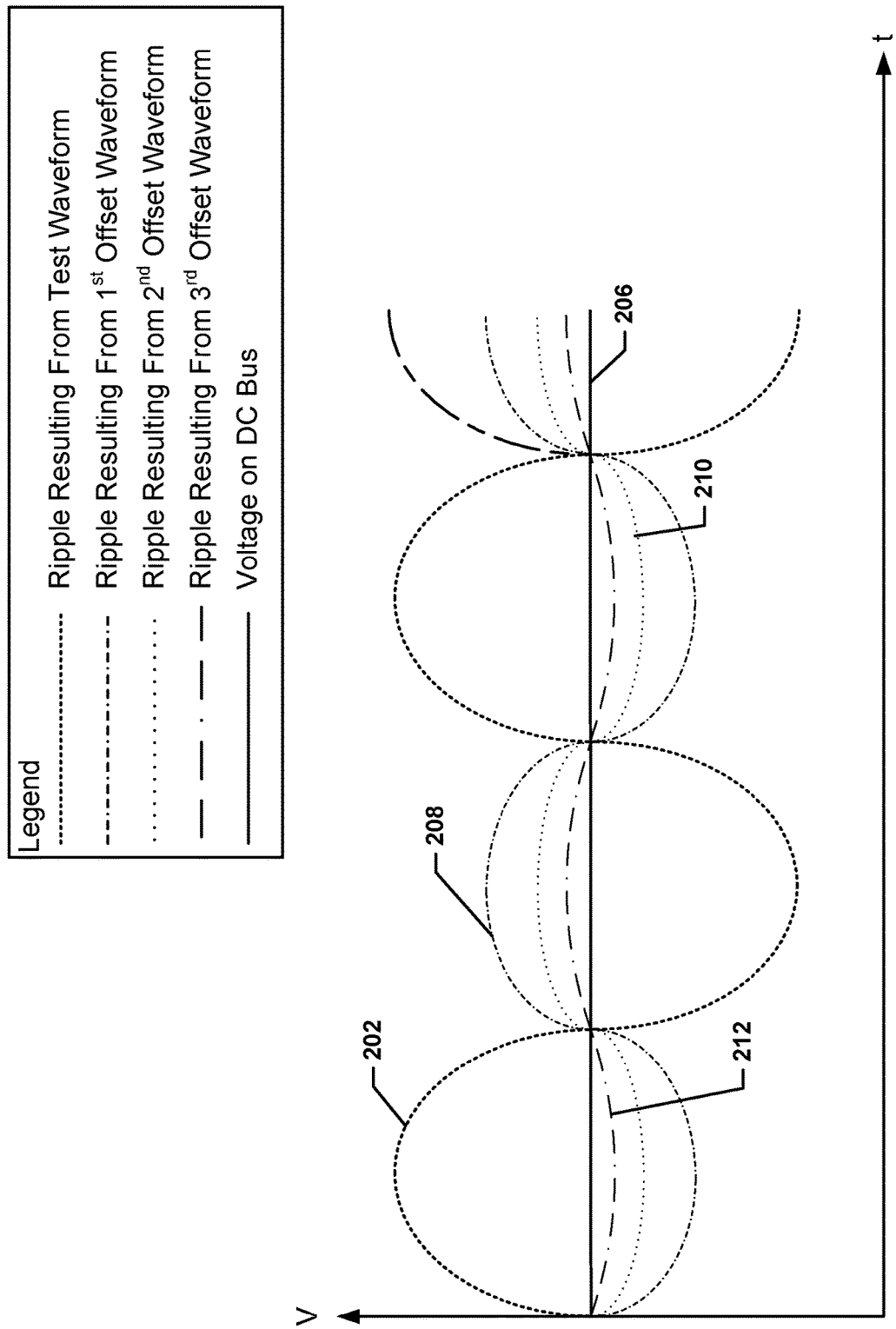

FIG. 2B is another graph illustrating canceling ripples on a DC bus over time using more than one offsetting waveform. As discussed above, a test waveform injected onto an input connection of a battery by a power electronics may result in a ripple 202 sent from the power electronics injecting the test waveform toward a DC bus. Three other power electronics may be used to generate offset waveforms injected onto input connections of three other batteries. The first offset waveform injected onto an input connection of a first other battery by the first other power electronics may result in a ripple 208 sent from that first other power electronics injecting the offset waveform toward the DC bus. The second offset waveform injected onto an input connection of a second other battery by the second other power electronics may result in a ripple 210 sent from that second other power electronics injecting the offset waveform toward the DC bus. The third offset waveform injected onto an input connection of a third other battery by the third other power electronics may result in a ripple 212 sent from that third other power electronics injecting the offset waveform toward the DC bus. The three offset waveforms may be selected such that the sum of the ripples 208, 210, and 212 may cancel ripple 202 such that the sum of the waveforms is the desired DC voltage 206 on the DC bus. While illustrated in FIGS. 2A and 2B as one generated offsetting ripple 204 or three offsetting ripples 208, 210, 212 with the same frequency as the ripple 202, more or less offsetting ripples, with different waveforms, different frequencies, phases, amplitudes, etc. may be generated and injected toward the DC bus as long as the total of any offsetting ripples plus the ripple 202 sent from the power electronics injecting the test waveform toward the DC bus results in the desired DC voltage 206 on the DC bus with no ripple.

Figure 3:
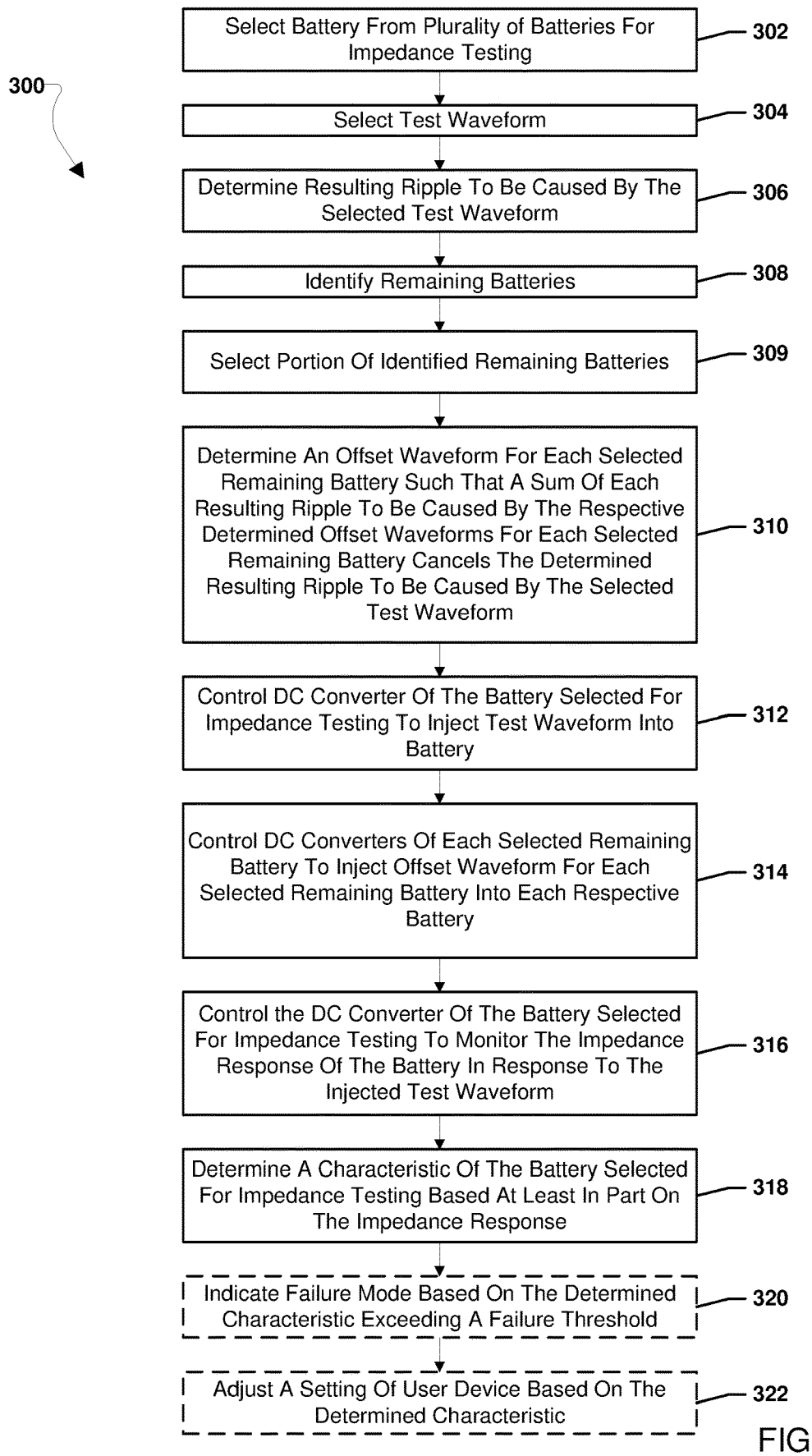
FIG. 3 is a process flow diagram illustrating an embodiment method for canceling the ripple to a DC bus caused by a test waveform.

FIG. 3 illustrates an embodiment method 300 for performing an EIS procedure on a battery stack. In an embodiment, the operations of method 300 may be performed by a controller, such as controller 138. The operations of method 300 are discussed in terms of battery stack segments and DC converters, but battery stack segments and converters are used merely as examples. Other batteries and/or other power electronics may be used in the various operations of method 300.

In block 302, the controller 138 may select a battery stack segment from a plurality of battery stack segments for impedance testing. For example, the battery stack segment may be selected based on a testing protocol governing when and in what order battery stack segments may be tested. In block 304 the controller 138 may select a test waveform. The test waveform may be selected to generate necessary oscillations for EIS monitoring, such as oscillations of approximately 1 Hz.

In block 306, the controller 138 may determine a resulting ripple to be caused by the selected test waveform. As discussed above, the resulting ripple may be the ripple output to the DC bus from the DC converter injecting the test waveform. In block 308 the controller 138 may identify the remaining battery stack segments. The remaining battery stack segments may be the battery stack segments not selected for impedance testing. In block 310 the controller 138 may select a portion of the identified remaining battery stack segments. In an embodiment, the selected portion may be all identified remaining battery stack segments. In another embodiment, the selected portion may be less than all identified remaining battery stack segments, such as only a single identified remaining battery stack segment.

In block 310, the controller 138 may determine an offset waveform for each selected remaining battery stack segment such that a sum of each resulting ripple to be caused by the respective determined offset waveforms for each selected remaining battery stack segment cancels the determined resulting ripple to be caused by the selected test waveform. In an embodiment, each offset waveform may be generated such that the resulting ripple is the same, such as one, two, three or more equal ripples that together cancel the ripple from the test waveform. In another embodiment, each offset waveform may be generated such that the resulting ripples are different, such as two, three, or more different ripples that together cancel the ripple from the test waveform.

In block 312, the controller 138 may control the DC converter of the battery stack segment selected for impedance testing to inject the test waveform into the battery stack. For example, the controller 138 may send control signals to a controller (e.g., 130, 132, 134, or 136) of the DC converter to cause the converter to perform pulse width modulation to generate the test waveform on an input connection to the battery stack segment.

In block 314, the controller 138 may control the DC converters of each selected remaining battery stack segment to inject the offset waveform for each selected remaining battery stack segment into each respective battery stack segment. For example, the controller 138 may send control signals to the controllers (e.g., 130, 132, 134, and/or 136) of the DC converters to cause the converters to perform pulse width modulation to generate the offset waveforms on an input connection to their respective battery stack segments.

The operations of the method 300 performed in blocks 312 and 314 may occur simultaneously, such that the test waveform and offset waveforms are injected at the same time resulting in ripples being output from the various DC converters that cancel each other out resulting in a desired DC voltage on the DC bus.

In block 316, the controller 138 may control the DC converter of the battery stack segment selected for impedance testing to monitor the impedance response of the battery stack in response to the injected test waveform. For example, the controller 138 may monitor the voltage and current response of the segment and determine the impedance according to method 500 described below with reference to FIG. 5.

In block 318, the controller 138 may determine a characteristic of the battery stack segment selected for impedance testing based at least in part on the impedance response. For example, the controller may use EIS monitoring to plot the real and imaginary parts of the measured impedances resulting from the injected test waveform and compare the plotted impedances to the known signatures of impedance responses of battery stack segments with known characteristics. The known signatures of impedance responses of the battery stack segments with known characteristics may be stored in a memory available to the controller (e.g., from a learned EIS database provided by an EISA network deployed in the cloud). The stored known signatures of impedance responses of the battery stack segments with known characteristics may be plots of the real and imaginary parts of the measured impedances of healthy battery stack segments and damaged/degraded battery stack segments derived from testing healthy (i.e., undamaged/undegraded) and damaged/degraded battery stack segments with various forms of damage (e.g., anode cracking) and/or degradation (e.g., segments operating in fuel starvation mode). The known characteristics may be correlated with the plots of the real and imaginary parts of the measured impedances stored in the memory. By matching the measured impedances to the known signatures of impedance responses, the current characteristics or state of the battery stack may be determined as those characteristics correlated with the matching known signature of impedance response.

In optional block 320, the controller 138 may indicate a failure mode based on the determined characteristic exceeding a failure threshold. For example, if the determined characteristic exceeds a failure threshold a failure mode of the battery stack may be indicated.

In optional block 322, the controller 138 may adjust a setting of the battery system based on the determined characteristic. For example, the controller 138 may initiate charging adjust a charging or discharging rate (e.g., increase or decrease), or shut off of the battery system based on the determined characteristic. In this manner, impedance testing, such as EIS monitoring, may be used in a battery system to adjust the operation of the battery system based on current characteristics of the battery stack segments.

Figure 4:
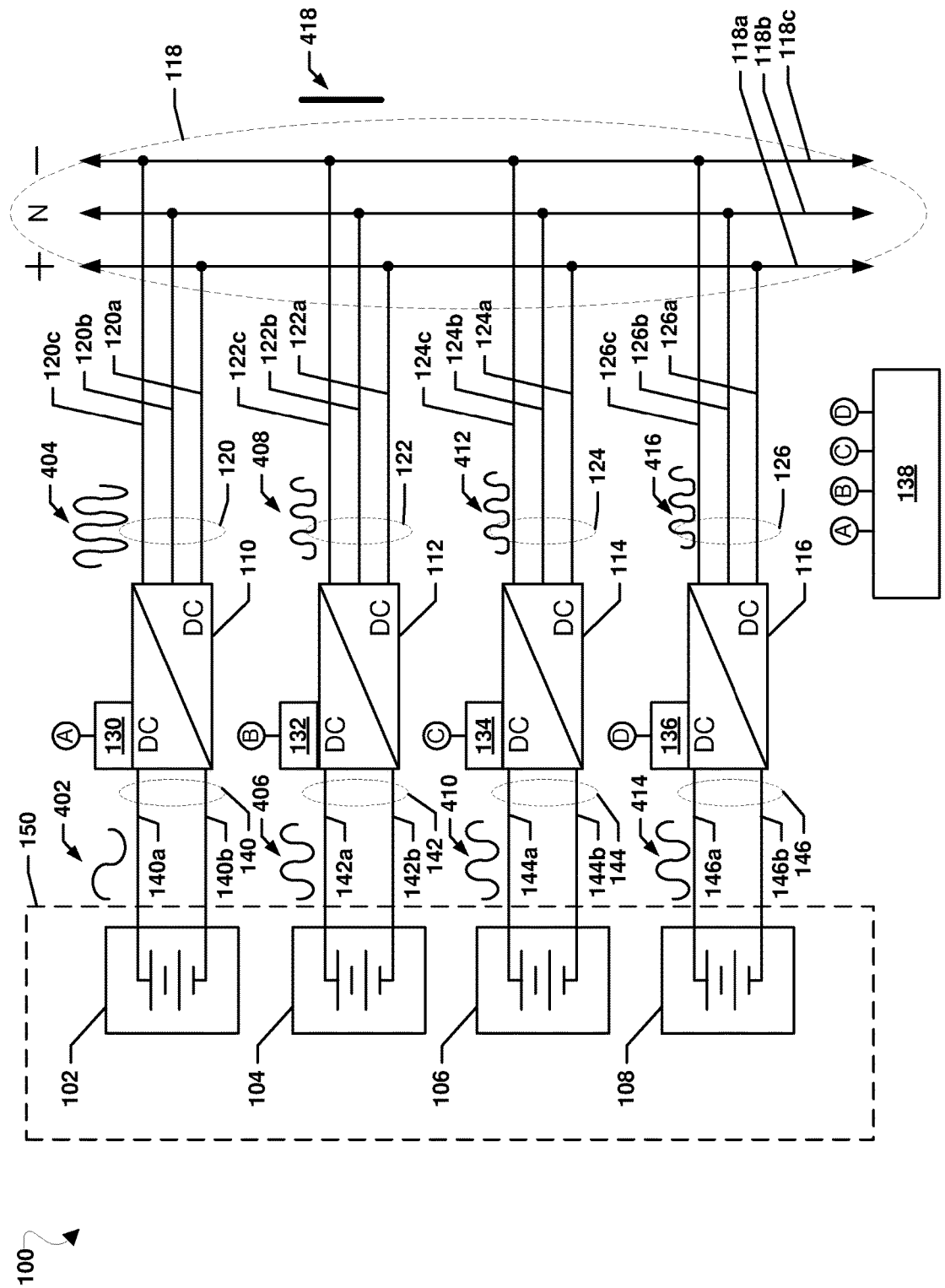
FIG. 4 is a block diagram of a system illustrating injected waveforms and resulting canceling ripples according to an embodiment.

FIG. 4 is a block diagram of the system 100 described above with reference to FIG. 1, illustrating injected waveforms 402, 406, 410, and 414 and resulting canceling ripples 404, 408, 412, and 416 according to an embodiment. A test waveform 402 may be injected into the input connection 140 resulting in a ripple 404 on the output connection 120 to the DC bus 118. An offset waveform 406 may be injected into the input connection 142 resulting in an offset ripple 408 on the output connection 122 to the DC bus 118. An offset waveform 410 may be injected into the input connection 144 resulting in an offset ripple 412 on the output connection 124 to the DC bus 118. An offset waveform 414 may be injected into the input connection 146 resulting in an offset ripple 416 on the output connection 126 to the DC bus 118. The sum of the ripples 404, 408, 412, and 416 may be such that steady DC voltage 418 without a ripple occurs on the DC bus 118 despite AC ripples occurring on the output connections 120, 122, 124, and 126. While the sum of the ripples 404, 408, 412, and 416 may be such that steady DC voltage 418 without a ripple results on the DC bus 118, the sum of the offset waveforms 406, 410, and 414 and the test waveform 402 need not equal zero. The offset ripples 408, 412, and 416 may all be the same or may be different. For example, offset ripple 408 may be a larger ripple than offset ripples 412 and 416. Additionally, whether or not the offset ripples 408, 412, and 416 are the same or different, the offset waveforms 406, 410, and 414 may not be the same. While three offset waveforms 406, 410, and 414 and their resulting offset ripples 408, 412, and 416 are illustrated, less offset waveforms and offset ripples, such as only two offset waveforms and resulting offset ripples or only one offset waveform and one resulting offset ripple, may be generated to offset the ripple 404.

In an alternative embodiment, the offset ripples 408, 412, and/or 416 may be generated by other devices, such as waveform generators, connected to output connections 122, 124, 126 and controlled by the controller 138, rather than the power electronics 112, 114, and/or 116. The offset ripples 408, 412, and/or 416 may be generated by the other devices such that the sum of the ripples 404, 408, 412, and 416 may be the steady DC voltage 418 without a ripple on the DC bus 118. Additionally, combinations of ripples generated by the power electronics 112, 114, and/or 116 and the other devices, such as additional waveform generators, may be used to cancel the ripple 404 resulting in the steady DC voltage 418 without a ripple on the DC bus 118.

Figure 5:
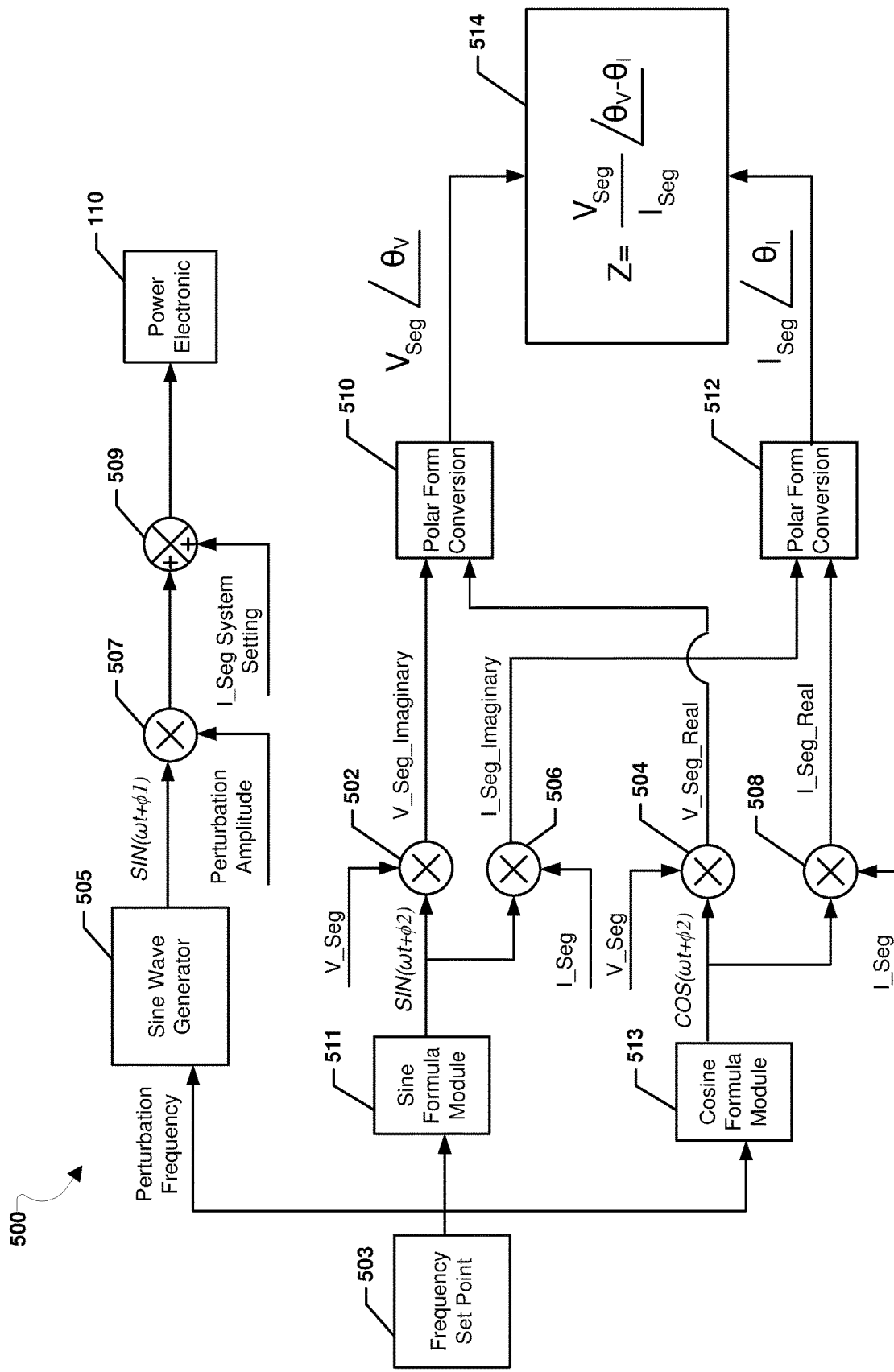
FIG. 5 is a component flow diagram illustrating an example waveform generator for determining an impedance response for a battery.

FIG. 5 is a system block diagram illustrating a waveform generator 500 for generating wave forms for performing EIS monitoring of a battery segment. The elements of the waveform generator 500 are discussed in terms of battery stack segments and DC converters, but battery stack segments and converters are used merely as examples. Other batteries and/or other power electronics may be used in the various operations of method 500. In an embodiment, the waveform generator 500 may operate in conjunction with the operations of method 300 described above with reference to FIG. 3.

In an input 503 the controller 138 may input a frequency set point (f) for a particular EIS monitoring process. The frequency set point may be output to a sine wave generator 505 as the perturbation frequency. The sine wave generator 505 may output a waveform SIN($\omega$t+$\phi$1) in which $\omega$ is the fundamental frequency (2$\pi$f) and $\phi$1 is the phase angle. In multiplier circuit 507 the output waveform multiplied by the perturbation amplitude, and the result may be added to the segment set as a system setting (I_Seg System Setting) in adder circuit 509 to generate a test waveform that may be sent to the power electronic 110 for injecting the waveform into the battery segment. The current for the segment set as a system setting may be a current setting provided from the controller 138 or another controller as a target current setting for the battery segment. The power electronic 110 illustrated in FIG. 5 may be any one of the power electronics 110, 112, 114, or 116 and similar operations may be performed to control power electronics 112, 114, and 116 to inject test waveforms.

The frequency set point may also be output to a sine formula module 511 and a cosine formula module 513. The sine formula module 511 may output a waveform SIN($\omega$t+$\phi$2) in which $\omega$ is the fundamental frequency (2$\pi$f) and $\phi$2 is the phase angle. The cosine formula module 513 may output a waveform COS($\omega$t+$\phi$2) in which $\omega$ is the fundamental frequency (2$\pi$f) and $\phi$2 is the phase angle.

In multiplier circuit 502 the output waveform from the sine formula module 511 may be multiplied with the voltage of the segment (V_Seg) to determine the imaginary voltage component of the segment (V_Seg_Imaginary). In multiplier circuit 506 the output waveform from the sine formula module 511 may be multiplied with the current of the segment (I_Seg) to determine the imaginary current component of the segment (I_Seg_Imaginary).

In multiplier circuit 504 may multiply the output waveform from the cosine formula module 513 with the voltage of the segment (V_Seg) to determine the real voltage component of the segment (V_Seg_Real). In multiplier circuit 508 the output waveform from the cosine formula module 513 may be multiplied with the current of the segment (I_Seg) to determine the real current component of the segment (I_Seg_Real).

Module 510 and 512 may respectively convert the real and imaginary components of the voltage of the segment and the real and imaginary components of the current of the segment to polar form voltage of the segment and polar form current of the segment.

Module 514 may determine the impedance "Z" of the segment as the polar form voltage of the segment over the polar form current of the segment. In this manner, the waveform generator 500 may enable a Fourier series calculation to be used to allow for analysis of an imperfect sinusoidal ripple at the fundamental frequency without needing to calculate a full Fast Fourier Transform. This may increase the accuracy of the impedance calculation and decrease the processing time required to determine an impedance response in comparison to impedance determinations made using a full Fast Fourier Transform.

Figure 6:
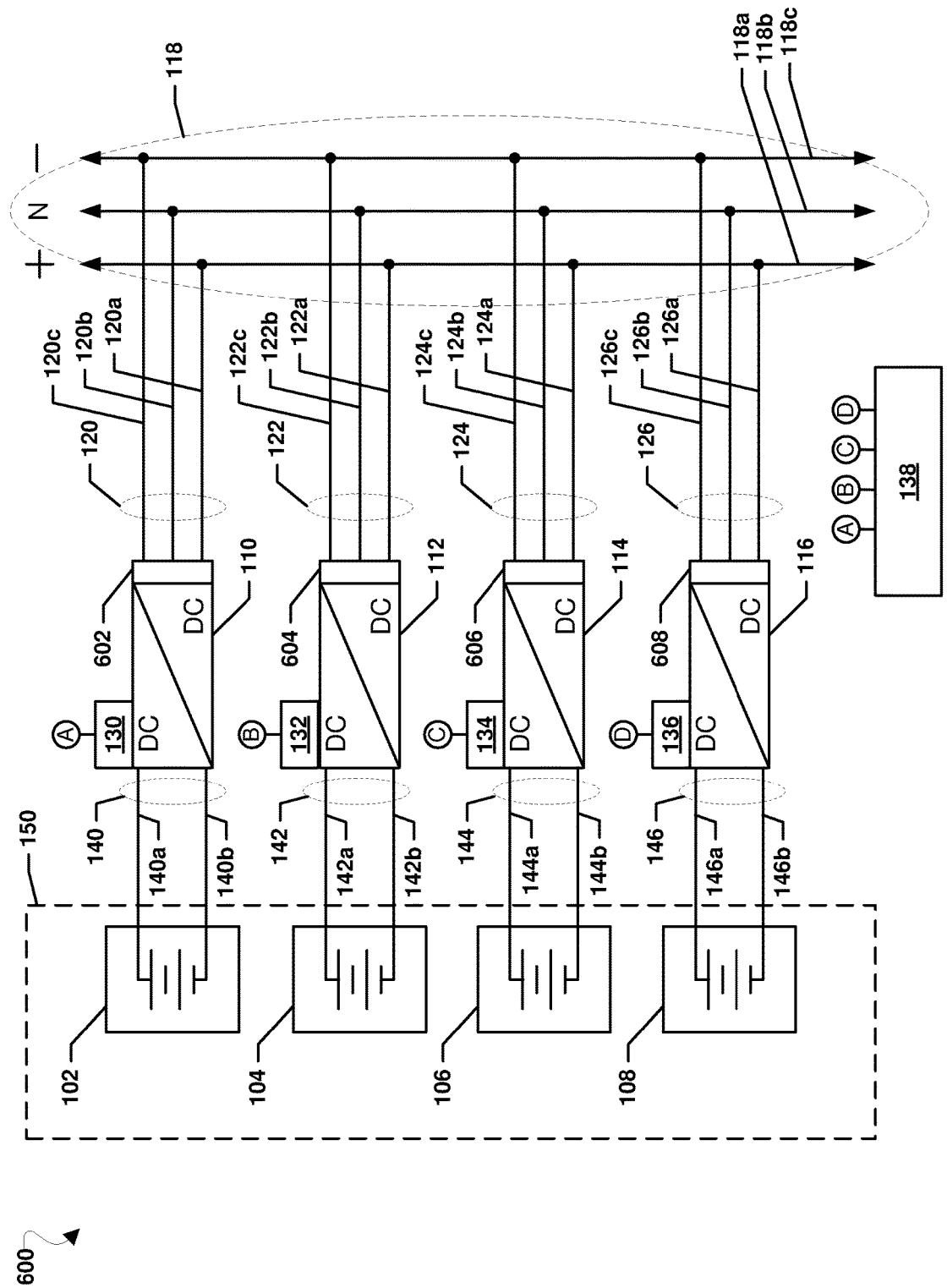
FIG. 6 is a block diagram of a system according to another embodiment.

FIG. 6 is a block diagram of a system 600 according to another embodiment. The system 600 is similar to system 100 illustrated in FIG. 1 and includes a number of components in common. Those components which are common to both systems 100 and 600 are numbered with the same numbers in FIGS. 1 and 6 and will not be described further.

The system 600 is similar to the system 100 described above with reference to FIG. 1, except that energy storage devices 602, 604, 606, and 608 may be included on the power electronics 110, 112, 114, and 116, respectively. Energy storage devices 602, 604, 606, and 608 may be any type of energy storage devices, such as capacitors, supercapacitors, batteries, etc. In an embodiment, the energy storage devices 602, 604, 606, and 608 may be on the output of their respective power electronics 110, 112, 114, and 116 to store ripple energy and discharge the ripple energy out of phase. The discharge out of phase by an energy storage device 602, 604, 606, or 608 may provide cancelation of the ripple current output on the respective output connection 120, 122, 124, or 126 to the DC bus 118 as a result of a test waveform injected into the input connection of the power electronic 110, 112, 114, or 116 associated with that energy storage device 602, 604, 606, or 608. In this manner, the energy storage device 602, 604, 606, or 608 may reduce the ripple current, or eliminate the ripple current, passing to the DC bus 118. The ability to reduce and/or eliminate the ripple current resulting from EIS testing may enable EIS testing using test waveforms with higher frequencies than may be used without the energy storage devices 602, 604, 606, or 608. For example, test waveforms with frequencies at or above 400 Hz may be used, greatly extending the bandwidth of the respective power electronics 110, 112, 114, and 116 to create and analyze test waveforms. Without the energy storage devices 602, 604, 606, or 608, the bandwidth of the test waveform frequencies may be practically limited to frequencies less than the switching frequency of the power electronics 110, 112, 114, and 116. With the energy storage devices 602, 604, 606, or 608, the bandwidth of the test waveform frequencies may extend to frequencies greater than the switching frequency of the power electronics 110, 112, 114, and 116.

While illustrated as on the output of their respective power electronics 110, 112, 114, and 116 in FIG. 6, the energy storage devices 602, 604, 606, and 608 may be on any other portions of their respective power electronics 110, 112, 114, and 116 to store ripple energy and discharge the ripple energy out of phase. In an alternative embodiment, the energy storage devices 602, 604, 606, and 608 may be on the input of their respective power electronics 110, 112, 114, and 116 to store ripple energy and discharge the ripple energy out of phase. In another alternative embodiment, an additional winding may be added to the transformers of the energy storage devices 602, 604, 606, and 608 and the energy storage devices 602, 604, 606, and 608 may be connected to the additional winding to store ripple energy and discharge the ripple energy out of phase.

EIS helps in understanding electrochemical processes by analyzing reflected electric signals that result when small, variable frequency electric signals are sent as test signals (a "test waveform") towards a battery or circuit under test.

Batteries' performance and health may be tested and characterized by analyzing the responses of batteries against different types of input waveforms (electric signals) using EIS.

U.S. Pat. No. 9,461,319, incorporated herein by reference in its entirety, teaches a method of performing EIS on fuel cells. A microcontroller, as shown part of an EIS system, may perform EIS tests with the help of a tester circuit. A microprocessor may apply and control the type of waveform and time of application, frequency of the signal and other associated parameters. A battery may act as load to the test waveforms (e.g., small voltage signals). The response waveform of the battery may be measured and stored. This data may be indicative of the state of the battery. For example, a 110 Hz sinusoidal signal may return as a chopped 105 Hz signal. The changes to the input signal may be a manifestation of changes happening inside the battery. The internal changes in the battery could be due to changes in diffusion rate of ions at the electrode of the battery or due to wear and tear around the anode contact to the battery cells.

In some embodiments, a service may be provided to consumers using data analysis results from EIS. Some embodiments may include an EISA system that may send collected EIS data to a remote server, such as in "the cloud," where the EIS data may be combined with other EIS data and analyzed in order to extract insights on the EIS data. These insights may be used as a service to enhance battery usage, such as by providing battery related recommendations to a user. Examples of such service-provided recommendations may include a time for replacement of a battery, suggestions for better charging cycles for a battery, suggestions for better batteries (sizes) to purchase, etc. In some embodiments, the systems and methods may be used to provide insights and recommendations to consumers that could improve battery function and increase device life on any or all of their electronic devices.

Figure 7:
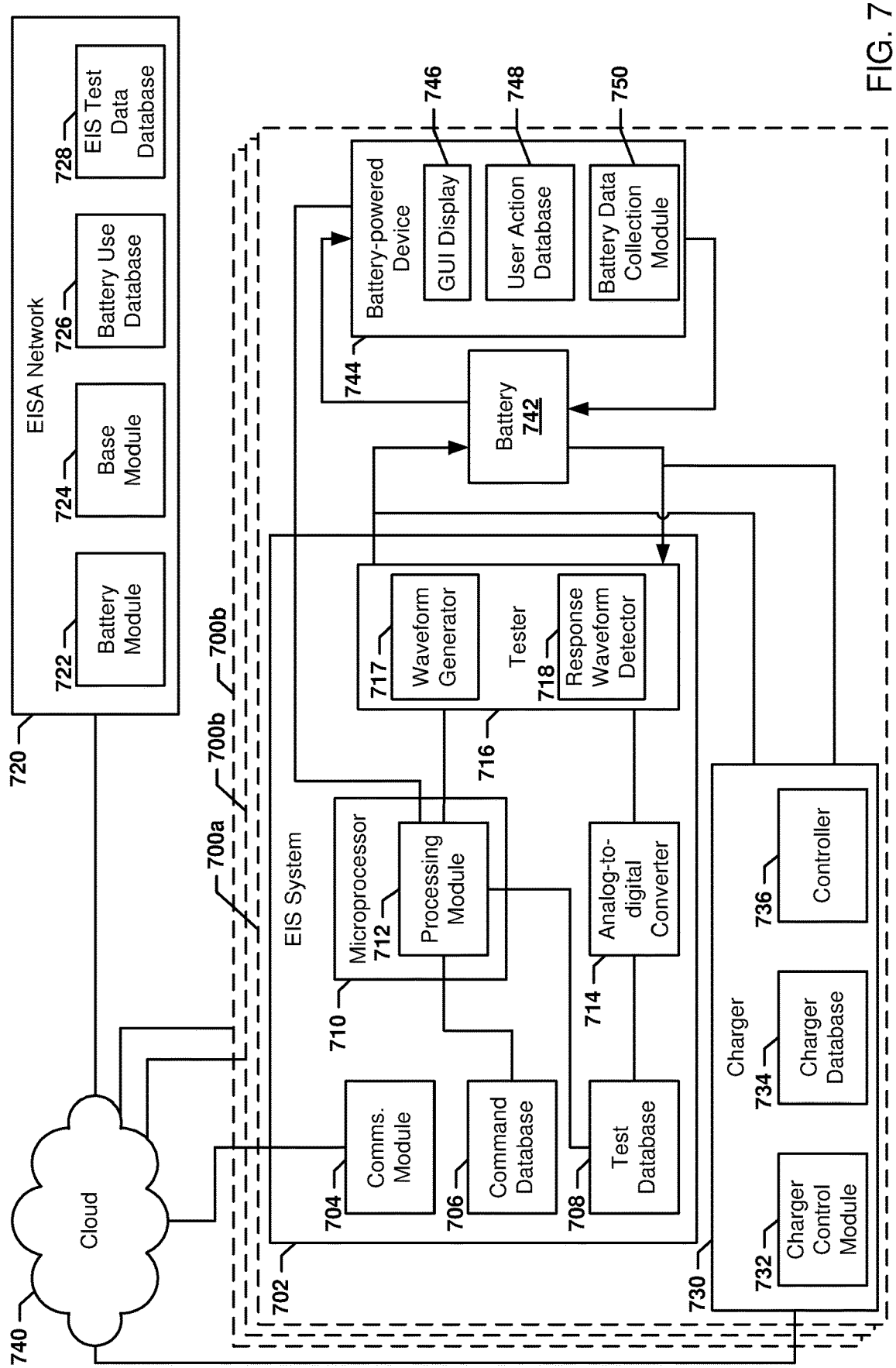
FIG. 7 is a block diagram of an electrochemical impedance spectroscopy (EIS) system connected to a device battery, a charger for a battery, a battery powered device, and an electrochemical impedance spectroscopy analyzer (EISA) network according to an embodiment.

FIG. 7 illustrates an example of a plurality of EISA systems 700a, 700b, 700c according to an embodiment, each of which includes an EIS system 702, an example of which is described in U.S. Pat. No. 9,461,319, incorporated herein by reference in its entirety. Each EISA system 700a, 700b, 700c may include the EIS system 702 connected to a device battery 742, a charger 730 for the battery 742, and a battery powered device 744. Each EISA system 700a, 700b, 700c may be communicatively connected to an EISA network 720 via the Internet 740, such as in a cloud deployment.

The EIS system 702 may allow running EIS tests on the battery 742 at the convenience of the battery powered device to obtain data regarding battery performance and conditions. The EIS 702 system may include a processing module 712 configured to extract EIS testing parameters and commands from a test database 708 and command database 706, which may contain various parameters and commands for an EIS system battery tester circuit 716, such as real time waveforms of voltage/current outputs, times for voltages/current output, times for sampling voltages/current, etc. The command database 706 and the test database 708 may be stored in any combination of persistent or volatile memories of the EIS system 702. In some embodiments, aspects of the command database 706 and the test database 708 may be combined into one of the databases 706, 708. The battery tester circuit 716 may include a test waveform generator 717 configured to apply EIS test waveforms to the battery 742, and a response waveform detector 718 configured to measure voltage and/or current across the battery at sampling intervals to determine response waveforms. The processing module 712 may send the EIS testing parameters and commands to the battery tester circuit 716, measure a voltage/current that comes back to the battery tester circuit 716, receive an output voltage/current, and store all of the data in the test database 708. An analog-to-digital converter 714 may convert digital signals of the EIS testing parameters and commands, sent by the processing module 712 to the battery tester circuit 716, to analog signals, and convert analog signals of the output voltage/current, sent by the battery tester circuit 716 to the processing module 712, to digital signals.

The EIS system 702 may include a communication module 704, represented as "Comms. Module" in FIG. 7, which may allow the EIS system 702 to communicate with the EISA network 720. The communication module 704 may support both wired and wireless communication capabilities such as Ethernet, WIFI, Bluetooth, etc. The processing module 712 may connect to a battery module 722 and send the data from the test database 708 to the battery module 722.

A network of the EISA systems 700a, 700b, 700c may include any number of battery powered devices 744. Each battery powered device 744 may be associated with a user and/or an EISA system 700a, 700b, 700c. Each battery powered device 744 may include a graphical user interface (GUI) 746 and a separable and/or integrated battery 742. The battery 742 may be connected to a charger 730.

The charger 730 may be separable and/or integrated within the battery powered device 744. The charger 730 may include a controller 736 for controlling charging, which may be configured to start charging when connected to alternating current (AC) power, and discontinue charging when the battery charge state reaches 100%. The charger 730 may include a charger database 734 for storing charging related parameters that may be preloaded or downloaded from the EISA network 720, for example, via the cloud 740, using a charger control module 732. The charger database 734 may be stored on a persistent or volatile memory of the charger 730. The charger control module 732 may be configured to receive instructions from the EIS system 702, such as from a processing module 712, and/or from the battery powered device 744 directly. Optionally, the charger control module 732 may receive instructions and data from the EISA network 720, such as from a battery module 722.

The battery 742 may also be connected to the EIS System 702 configured for performing EIS tests on the battery 742. The EIS system 702 may include a microprocessor 710, which may include the processing module 712. The processing module 712 may receive input from the battery powered device 744 for conducting the EIS tests and reporting the results back to the battery powered device 744. The processing module 712 may be connected to the command database 706 and the test database 708, which each may contain EIS testing parameters and/or commands downloaded from the EISA network 720, such as from a base module 724.

The EISA network 720 may maintain a battery use database 726 for collecting and storing all the data received from the various battery-powered devices 744 and the EIS systems 702 regarding battery events, user actions (which may include battery events implemented by a user), and EIS tests and EIS responses. The battery use database 726 may be stored on a persistent or volatile memory of the EISA network 720.

The battery powered device 744 may also include a user action database 748 for storing actions that a user may take with respect to the battery 742, such as charging the battery, purchasing a new battery, replacing an old battery, etc. The user actions may correspond to battery events implemented by a user. The user action database 748 may be stored in a persistent or volatile memory of the battery powered device 744.

The battery powered device 744 may additionally include a battery data collection module 750 that may initiate a process of EIS testing the battery 742 and collecting data related to battery EIS tests and battery events. The battery data collection module 750 may also interact with the battery module 722 to obtain or receive battery related suggestions based on uploading data from the user action database 748 to the battery use database 726. The battery data collection module 750 may be communicatively connected to the EISA network 720 via the EIS system 702, such as through the processing module 712 and the communication module 704.

In some embodiments, the system 700a, 700b, 700c may be initiated and the battery data collection module 750 may initiate the processing module 712. The processing module 712 may extract an EIS testing command and/or parameters from the command database 706 and/or the test database 708, which may contain various EIS testing commands and/or parameters for the battery tester circuit 716, such as voltage/current outputs, times for voltages/current output, times for sampling voltages/current, etc.

The processing module 712 may send the EIS testing command and/or parameters to the battery tester circuit 716, measure the resulting response waveform (the varying voltage/current observed in the battery tester circuit 716), receive the output voltage/current response waveform, and store all of the data to the test database 708. The data resulting from the EIS test and stored to the test database 708 by the processing module 712 may be in a digital format representing a response waveform of voltage/current over a period.

The battery data collection module 750 may receive the EIS testing command and/or parameters and the response waveform. In response to a battery event, the data from the user action database 750 may be sent to the EISA network 720 where the battery module 722 may store the data in the battery use database 726.

The battery module 722 may constantly or periodically poll the EISA system 700a, 700b, 700c and receive data from the user action database 748, which may be stored to the battery use database 726. The battery module 722 may run a learning algorithm, such as an artificial intelligence engine or a neural network, on the crowd sourced data stored in the battery use database 726 and the received data from the user action database 748. In response to the received data being similar to the crowd sourced data, the battery event may be determined to be correct. In response to the received data being dissimilar to the crowd sourced data, the battery module 722 may send a user action recommendation (e.g., a recommendation based upon crowd-sourced data and analysis) to the battery data collection module 750. The battery data collection module 750 may receive the user action recommendation from the battery module 722, and send the user action recommendation to the GUI 746. In some embodiments, the user action recommendation may be a paid user action recommendation, which may charge a fee to be paid before the recommendation is provided to the battery data collection module 750 and/or the GUI 746, and/or before being implementable by the user, such as in the case of a software and/or firmware download. The fee may be subscription fee and/or a per use fee.

Figure 8:
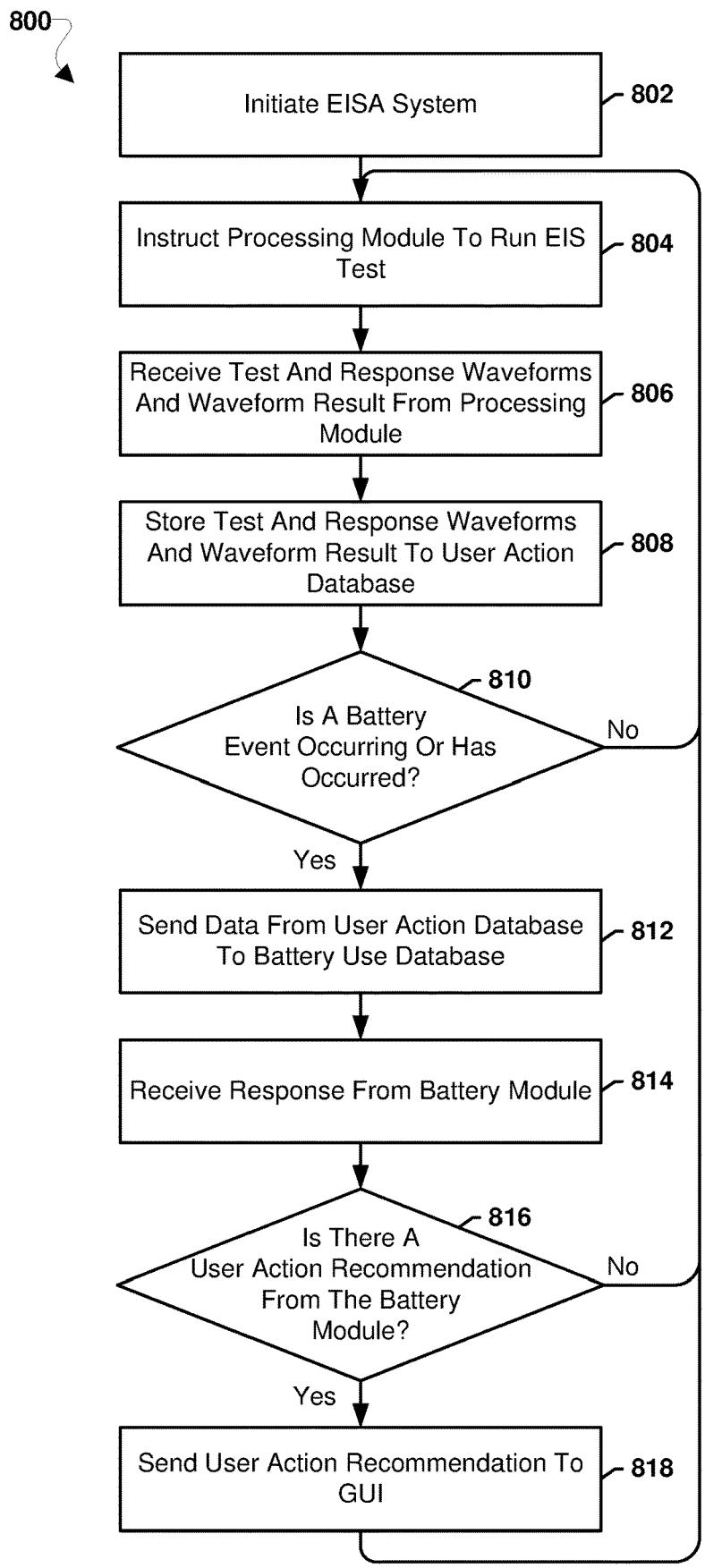
FIG. 8 is a process flow diagram illustrating a method for local battery management according to an embodiment.

FIG. 8 illustrates a method 800 for local battery management according to an embodiment. A battery powered device battery data collection module (e.g., battery data collection module 750 in FIG. 7) may initiate an EISA system (e.g., EISA system 700a, 700b, 700c in FIG. 7) and start to periodically or continuously request an EIS system processing module (e.g., processing module 712 in FIG. 7) to run an EIS test on a battery (e.g., battery 742 in FIG. 7). An EIS system (e.g., EIS system 702 in FIG. 7) may apply an EIS test waveform to the battery and send the response waveforms to the battery data collection module. After receiving the EIS test waveform and response waveform, the battery data collection module may determine whether a battery event is occurring or has occurred. A battery event may include any change in battery state, and/or action by a battery powered device (e.g., battery powered device 744 in FIG. 7) and/or user of the battery powered device that may influence a battery state. For example, a battery event may include the battery being charged or a display brightness of the battery powered device being lowered to reducing the load demand on the battery. A battery state may include a charging status, a charge level, a rate of charge and/or discharge, a battery condition (such as a health condition and/or failure condition) status, a battery identity, a hardware and/or software version for managing the battery, etc. In response to determining that a battery event is occurring or has occurred, the battery data collection module may upload the EIS test waveform and response waveform and the battery event, which may be stored in a battery powered device user action database (e.g., user action database 748 in FIG. 7), to an EISA network battery use database (e.g., battery use database 726 in FIG. 7) via an EISA network battery module (e.g., battery module 722 in FIG. 7). Optionally, a determination of a battery event may be made by the battery module, which may apply logic on the received EIS test waveform and response waveform and send an identified battery event to the battery powered device. In response to the battery data collection module receiving a user action recommendation from the battery module based on the uploaded data, the received user action recommendation(s) may be sent to a battery powered device GUI (e.g., GUI 746 in FIG. 7) for the user to select and/or implement the appropriate action. In some embodiments, the user action recommendation may be a paid user action recommendation. Example user action recommendations may include running a patch code, changing a charge cycle, replacing the battery with a new battery and/or a higher power battery, etc. In response to not receiving a user action recommendation from the battery module, the battery data collection module may continue to prompt the processing module to run an EIS test.

The method 800 may be implemented in software executing in a software-configurable processor (such as a central processing unit, graphics processing unit, etc.), in general purpose hardware, in dedicated hardware, or in a combination of a software-configured processor and dedicated hardware, such as a processor executing software within a system for EIS testing (e.g., EISA system 700a, 700b, 700c, battery powered device 744, battery data collection module 750 in FIG. 7), and various memory/cache controllers. In order to encompass the alternative configurations enabled in various embodiments, the hardware implementing the method 800 is referred to herein as a "control device."

In block 802, the control device may initiate an EISA system to perform EIS testing of a battery. An EISA system may be in a powered off or standby state prior to being initiated. A user and/or a process of a battery powered device of the EISA system may trigger initiation of the EISA system. For example, the user may actuate a power switch of the battery powered device of the EISA system, connect the battery powered device to a power source, and/or interact with the battery powered device to trigger a process of the battery powered device configured to initiate the EISA system. A process of the battery powered device may also be triggered, for example, based on a time, a change in state of a battery and/or the battery powered device, etc. To initiate the EISA system, the control device may control a flow of power to the EISA system and/or send instructions to the EISA system to initiate.

In block 804, the control device may instruct/request a processing module to run an EIS test on a battery. In some embodiments, the control device may send a signal to be interpreted by the processing module as an indicator to run the EIS test on the battery. A method for running the EIS test on the battery is discussed further herein as part of the method 900 described with reference to FIG. 9.

In block 806, the control device may receive a test waveform, a response waveform, and a waveform result from the processing module. The test waveform may be a test waveform applied to the battery to perform the EIS test. The response waveform may be a measured and recorded response waveform output by the battery in response to the test waveform being applied. The waveform result may be a result of a comparison of the response waveform or of a calculated value based on an analysis of the test waveform and the response waveform to a predetermined, learned, and/or downloaded range. In some embodiments, the analysis of the test waveform and the response waveform may include comparison of the test waveform and the response waveform as a difference between the test waveform and the response waveform to the test waveform represented as a number or score as a percentage, fraction, etc. In some embodiments the comparison of the response waveform or calculated value to the range may be made in terms of frequency, amplitude, etc. of the waveform(s).

In block 808, the control device may store the test waveform, the response waveform, and the waveform result to a user action database. In some embodiments, the test waveform, the response waveform, and the waveform result may be stored to the user action database in a manner that associates the test waveform, the response waveform, and the waveform result in an entry with a user identifier, an EISA system identifier, and/or a battery event. An example of a user action database is discussed further herein with reference to FIG. 14.

In determination block 810, the control device may determine whether a battery event is occurring or has occurred. In some embodiments, the control device may determine that a battery event is occurring or has occurred from analyzing an abnormal response waveform and/or waveform result. In some embodiments, the control device may monitor the battery and/or the battery powered device and detect that a battery event is occurring or has occurred by detecting a change in battery state, an action by the battery powered device, and/or an action by a user of the battery powered device that may influence a battery state. For example, a battery event may include the battery being charged or a display brightness of the battery powered device being lowered to reducing the load demand on the battery. A battery state may include a charging status, a charge level, a rate of charge and/or discharge, a battery condition (such as a health condition and/or failure condition) status, a battery identity, a hardware and/or software version for managing the battery, etc. In response to detecting a change or action that may be related to a battery event, the control device may determine that a battery event is occurring or has occurred, and in response to not detecting such a change or action, the control device may determine that a battery event is not occurring or has not occurred.

In response to determining that a battery event is occurring or has occurred (i.e., determination block 810="Yes"), the control device may send data from the user action database to a battery use database on an EISA network (e.g., EISA network 720 in FIG. 7) in block 812. In some embodiments, the control device may send any combination of the data stored to the user action database, the combination of which may be referred to herein as battery data. The battery data may include any combination of the user identifier, EISA system identifier, the test waveform, the response waveform, the waveform result, and the battery event. In some embodiments, the control device may send the battery data to the battery use database directly from the battery powered device. In some embodiments, the control device may send the battery data to the battery use database via an EIS system. Sending the battery data to the battery use database via the EIS system is discussed further herein as part of the method 900 described with reference to FIG. 9. In some embodiments, additional information, including any combination of battery identifying information, battery powered device identifying information, and charger identifying information, may be sent to the battery use database.

In block 814, the control device may receive a response from a battery module of the EISA network in response to uploading the battery data to the battery use database. In some embodiments, the control device may receive the response from the battery module either directly or via the EIS system. The response from the battery module may include a user action recommendation, such as a recommendation for the user to take an action regarding or affecting the battery. In some embodiments, the user action recommendation may be a paid user action recommendation.

In determination block 816, the control device may determine whether the response from the battery module includes a user action recommendation. In some embodiments, the control device may parse the response received from the battery module to determine whether any field in the response include recommendation text or a code linked to a prestored recommendation prestored in memory accessible by the control device. In some embodiments, the control device may determine that there is a user action recommendation from the battery module in response to determining that the user action recommendation differs from the change in state or battery-related action that was recognized as a battery event, such as by comparing the received user action recommendation to the change in state or battery-related action stored in the user action database associated with the sent battery data. In some embodiments, the control device may determine that the response from the battery module does not include a user action recommendation in response to determining that a user action recommendation in the response from the battery module is the same as a battery event in the user action database associated with the sent battery data. The control device may compare battery events of the response from the battery module and the user action database by comparing the battery events.

In response to determining that the response from the battery module includes a user action recommendation in (i.e., determination block 816="Yes"), the control device may display the user action recommendation in a GUI in block 818. The user may view, select, and/or implement a user action recommendation via interaction with the GUI through the battery powered device.

In response to determining that a battery event is not occurring or has not occurred (i.e., determination block 810="No"); in response to determining that the response from the battery module does not include a user action recommendation in (i.e., determination block 816="No"); or following displaying the user action recommendation in the GUI in block 818, the control device may instruct the processing module to run an EIS test on the battery in block 804.

Figure 9:
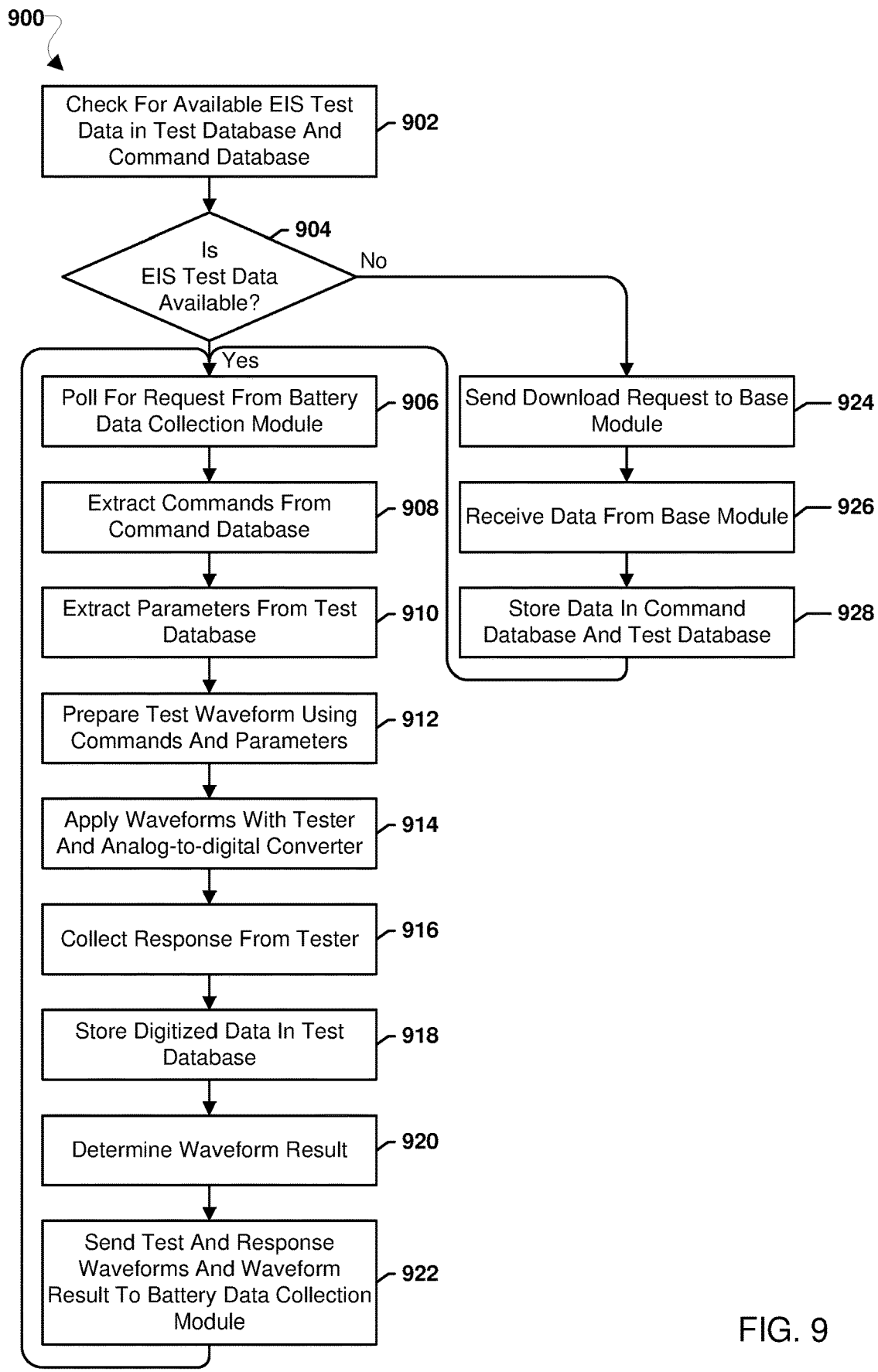
FIG. 9 is a process flow diagram illustrating a method for local battery management according to an embodiment.

FIG. 9 illustrates a method 900 for local battery management according to an embodiment. An EIS system processing module (e.g., processing module 712 in FIG. 7) may determine whether data is available in an EIS system command database (e.g., command database 706 in FIG. 7) and an EIS system test database (e.g., test database 708 in FIG. 7). In response to determining that such data is not available, the processing module may send a request to download EIS test data from an EISA network base module (e.g., base module 724 in FIG. 7). EIS test data downloaded in response may include an EIS testing command and/or parameters. The processing module may store the received EIS test data in the test database and in the command database. In some embodiments, the command database may contain EIS testing commands for how long to apply a test waveform and measure a response waveform, such as "Measure for 5 seconds." In some embodiments, the test database may contain EIS testing parameters that may describe the test waveform, such as a frequency of 110 Hz and a current of 3 mA. Once the command database and the test database are loaded with the EIS test data from an EISA network (e.g., EISA network 720 in FIG. 7), the processing module may the wait for a response from a battery powered device battery data collection module (e.g., battery data collection module 750 in FIG. 7). The battery data collection module may instruct the processing module to run an EIS test using the EIS test data. In response to the instruction to run the EIS test, the processing module may initiate the EIS test data from the command and test databases, and run the EIS test data through an EIS system digital-to-analog converter (e.g., digital-to-analog converter 714 in FIG. 7) to generate a test waveform for an EIS system battery tester circuit (e.g., battery tester circuit 716 in FIG. 7). The battery tester circuit may create and apply the test waveform to a battery (e.g., battery 742 in FIG. 7). The battery tester circuit may receive a response waveform from the battery and put the response waveform through the analog-to-digital converter. The processing module may store the digitized response waveform data to the test database. In some embodiments, the test database may store multiple types of information, including test waveform parameters and digitized response waveform data. The processing module may send the test waveform, response waveform, and waveform result to the battery data collection module and continue or return to polling for a request from the battery data collection module.

The method 900 may be implemented in software executing in a software-configurable processor (such as a central processing unit), in general purpose hardware, in dedicated hardware, or in a combination of a software-configured processor and dedicated hardware, such as a processor executing software within a system for EIS testing (e.g., EISA system 700a, 700b, 700c, EIS system 702, processing module 712 in FIG. 7), and various memory/cache controllers. In order to encompass the alternative configurations enabled in various embodiments, the hardware implementing the method 900 is referred to herein as a "control device."

In block 902, the control device may check for available EIS test data in a test database and a command database. The control device may have battery identifying information for a connected battery. Battery identifying information may include any information that may be used to identify the battery, such as any combination of a battery identifier, a battery size, a battery power capacity, a battery chemical composition, a battery brand, a battery powered device to which the battery is coupled (also referred to herein as a battery-powered device), etc. The control device may use the battery identifying information to request and retrieve EIS test data on and/or from entries associated with the battery identifying information in the test database and command database.

In determination block 904, the control device may determine whether EIS test data is available in the test database and the command database. Responses to requests for EIS test data from the test database and the command database may include EIS test data, an EIS test data indicator (such as a general confirmation of available EIS test data, a specific number of entries with available EIS test data, identification of entries with available EIS test data), no EIS test data, a no EIS test data indicator (such as a response of "0" entries or a null value), and/or an error. In response to receiving a response with EIS test data or an EIS test data indicator, the control device may determine that there is EIS test data available for the battery in the responding database. In response to receiving a response with no EIS test data, a no EIS test data indicator, and/or an error, the control device may determine that there is no EIS test data available for the battery in the responding database.

In response to determining that there is EIS test data available in the test database and the command database (i.e., determination block 904="Yes"), the control device may poll a battery data collection module for a battery EIS test request in block 906. The battery testing request may be a signal from the battery data collection module to run an EIS test on the battery. The request may instruct the control device to run an EIS test on the battery. The control device may check a communication interface, such as communication port or communication module (e.g., comms. module 704 in FIG. 7) of an EIS system, for a request from the battery data collection module.

In block 908, the control device may extract EIS testing commands from the command database. The control device may use the battery identifying information to request and retrieve the EIS testing commands from entries associated with the battery identifying information in the command database.

In block 910, the control device may extract EIS testing parameters from the test database. The control device may use the battery identifying information to request and retrieve EIS testing parameters from entries associated with the battery identifying information in the test database.

In block 912, the control device may prepare a test waveform using the EIS testing commands and the EIS testing parameters. The control device may use the EIS testing parameters to generate the test waveform and use the EIS testing commands to determine how long to generate the test waveform. The control device may load the EIS testing parameters and the EIS testing commands and use the EIS testing parameters and the EIS testing commands to signal an analog-to-digital converter with digital signals of instructions for generating the test waveform.

In block 914, the control device may apply the test waveform to the battery using a battery tester circuit. The control device may send the digital signals of instructions for generating the test waveform to the analog-to-digital converter so that the analog-to-digital converter may convert the digital signals to analog signals. The analog signals may be provided by the analog-to-digital converter to the battery tester circuit, which may respond to the analog signals by generating a test waveform according to the instructions of the analog signals. The battery tester circuit may apply the generated test waveform to the battery coupled to the EIS system. The battery tester circuit may apply the generated test waveform to the battery for a period as indicated by the analog signals and may cease generating the test waveform upon expiration of the period.

In block 916, the control device may receive an EIS response waveform from the battery tester circuit, which may determine the response waveform by measuring voltage or current across the battery at a sampling interval. The tester may provide the measurements of voltage or current at the sampling interval to the analog-to-digital converter, which may convert the analog voltage or current samples to digital values that the control device may use to determine the response waveform.

In block 918, the control device may store the digitized data in the test database. The control device may store the digital response waveform to the test database. In some embodiments, the control device may format the digital response waveform as a digital data file, such as a ".dat" format file. The control device may store the digital response waveform to the test database in a manner that enables the digital response waveform to be associated with battery identifying for the tested battery information in the test database.

In block 920, the control device may determine a waveform result. In some embodiments, the waveform result may be determined based on a comparison of the response waveform to the response waveform, such as a comparison of the test waveform and the response waveform to a predetermined, learned, and/or downloaded range of values or waveforms. In some embodiments, the analysis of the test waveform and the response waveform may include determining a difference between the test waveform and the response waveform represented as a number or score as a percentage, fraction, etc. In some embodiments the comparison of the test waveform and the response waveform or of a difference value to a range may be made in terms of, frequency, amplitude, etc. of the waveform(s).

In block 922, the control device may send the test waveform, the response waveform, and waveform result to the battery data collection module.

In block 906, the control device may continue to poll the battery data collection module for a battery EIS test request.

In response to determining that EIS test data is not available in the test database and the command database (i.e., determination block 904="No"), the control device may send a download request to a base module in block 924. The download request may include any combination of battery identifying information, battery powered device identifying information, user identifying information, EISA system identifying information, and charger identifying information.

In block 926, the control device may receive EIS test data from the base module. The data may include entire and/or partial entries of an EIS test data database (e.g., EIS test data database 728 in FIG. 7).

In block 928, the control device may store the EIS test data received from the base module in the test database and the command database. The control device may store the EIS test data to the test database and the command database in a manner such that the EIS test data may be associated with battery identifying information in the test database and the command database for the appropriate battery. With the EIS test data stored in the test database and the command database the control device may poll the battery data collection module for a battery EIS test request in block 902 as described above.

Figure 10:
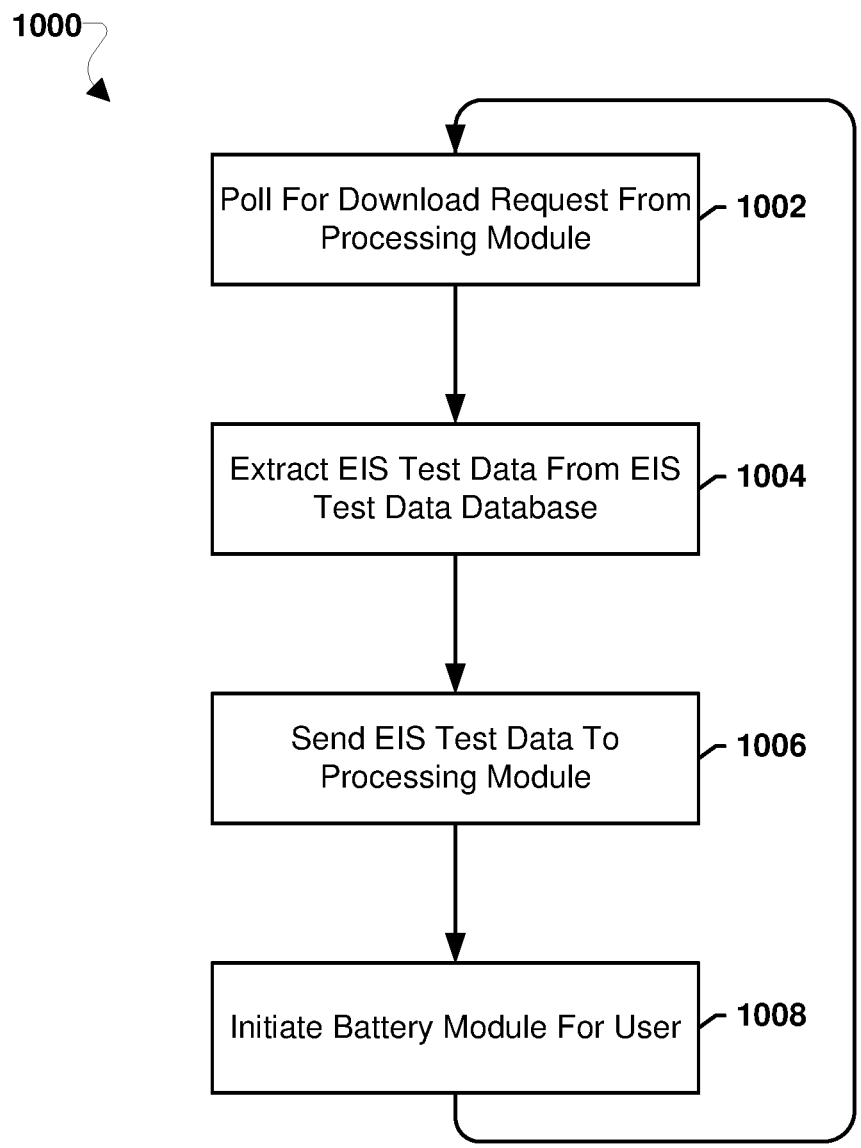
FIG. 10 is a process flow diagram illustrating a method for remote battery management according to an embodiment.

FIG. 10 illustrates a method 1000 for remote battery management according to an embodiment. An EISA network base module (e.g., base module 724 in FIG. 7) and a server (e.g., server 1700 in FIG. 17) within an EISA network (e.g., EISA network 720 in FIG. 7) may poll for download requests from and EIS system processing module (e.g., processing module 712 in FIG. 7). In response to receiving a download request from the processing module, the base module may extract EIS test data from an EISA network EIS test data database (e.g., EIS test data database 728 in FIG. 7) based on a type of battery powered device (e.g., battery powered device 744 in FIG. 7) and a type of battery (e.g., battery 742 in FIG. 7) for which the download request is received. The base module may send the extracted EIS test data to the processing module. The base module may initiate an EISA network battery module (e.g., battery module 722 in FIG. 7) for a corresponding user and/or EISA system (e.g., EISA system 700*a*, 700*b*, 700*c* in FIG. 7), and the battery powered device of the download request and continue polling requests from other battery powered devices connected to the EISA network, for example, via the cloud (e.g., cloud 740 in FIG. 7).

The method 1000 may be implemented in software executing in a software-configurable processor of a server of an EISA network. In order to encompass the alternative configurations enabled in various embodiments, the hardware implementing the method 1000 is referred to herein as an "EISA network server."

In block 1002, the EISA network server may poll for download requests from a processing module. The download request may include any combination of battery identifying information, battery powered device identifying information, user identifying information, EISA system identifying information, and charger identifying information.

In block 1004, the EISA network server may extract EIS test data from an EIS test data database. The EISA network server may use data from the download request, such as any combination of battery identifying information and battery powered device identifying information, to locate and retrieve entries from the EIS test data database. The extracted EIS test data may include EIS testing commands and parameters for implementing an EIS test on a battery of a type identified from the battery identifying information. In some embodiments, the EIS test data may include EIS testing commands and parameters for implementing an EIS test on the type of battery connected to a type of battery powered device identified from the battery powered device identifying information.

In block 1006, the EISA network server may send the EIS test data to the processing module.

In block 1008, the EISA network server may initiate a battery module for a user corresponding to the download request. The user may be identified from user identifying information received with the download request. In some embodiments, the EISA network server may initiate a battery module for an EISA system corresponding to the download request. The EISA system may be identified from EISA system identifying information received with the download request.

In block 1002, the EISA network server may continue to poll for download requests from a processing module. In some embodiments, the EISA network server may poll for download request from processing modules associated with other battery powered devices, users, and/or EISA systems. After a download request from a processing module associated with a battery powered device, user, and/or EISA system, the EISA system including the battery powered device may implement an EIS test. Therefore, the related processing module from the EISA system may not issue another download request until the EIS test has completed. In some embodiments, the EISA network server may return to polling for a download request from the processing module in response to an upload from a battery data collection module (e.g., battery data collection module 750 in FIG. 7) associated with the processing module.

Figure 11:
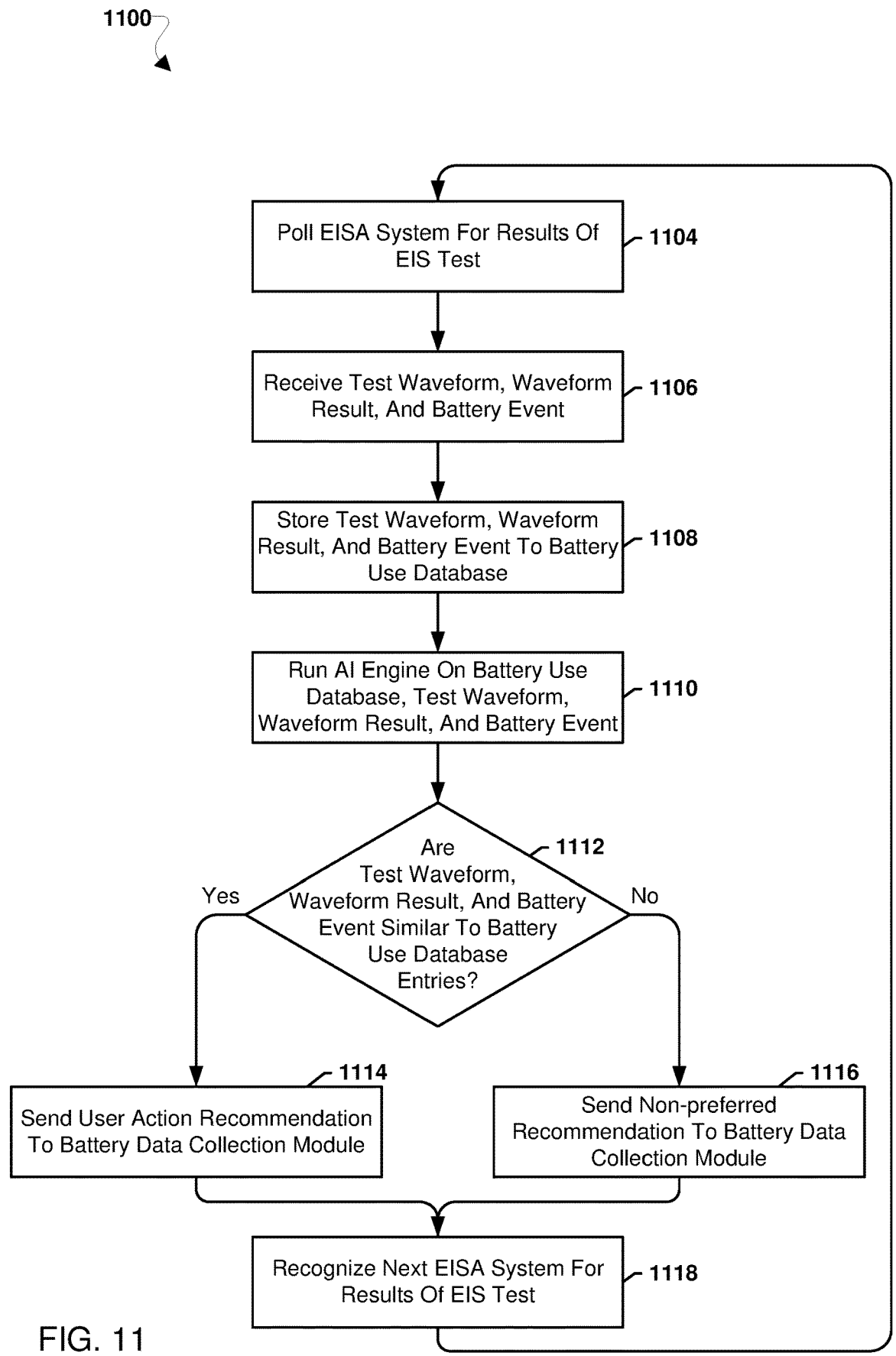
FIG. 11 is a process flow diagram illustrating a method for remote battery management according to an embodiment.

FIG. 11 illustrates a method 1100 for remote battery management according to an embodiment. An EISA network battery module (e.g., battery module 722 in FIG. 7) and a server (e.g., server 1700 in FIG. 17) within an EISA network (e.g., EISA network 720 in FIG. 7) may be initiated by an EISA network base module (e.g., base module 724 in FIG. 7), which may receive EIS test data from an EIS system (e.g., EIS system 702 in FIG. 7) associated with a battery powered device (e.g., battery powered device 744 in FIG. 7) conducting EIS tests. The battery module of the EISA network may start, constantly or periodically, polling individual battery powered devices amongst a plurality of battery powered devices that are connected to the EISA network. The battery module may receive an EIS test results from a battery-powered device battery data collection module (e.g., battery data collection module 750 in FIG. 7) of an EISA system of or connected to the responding battery-powered device. The received EIS test results may be in the form of a test waveform that was applied to a battery of the responding battery-powered device, a waveform result measured on the battery, and a battery event that the battery-powered device EISA system had detected and triggered the EIS test. The battery module may store the test waveform, the waveform result, and the battery event in an EISA network battery use database (e.g., battery use database 726 in FIG. 7). The battery module may apply a learning algorithm, an AI engine, neural network model or other inference engine to the test waveform, the waveform result, and the battery event along with historical EIS and battery event data stored for the same user and other users and/or same EISA system (EISA system 700a, 700b, 700c in FIG. 7) and other EISA systems with battery powered devices to generate a battery use database (e.g., battery use database 726 in FIG. 7). For ease of reference in the descriptions and the claims, the general term "artificial intelligence (AI) engine" is used to refer to any of learning algorithms, AI algorithms, neural network or other inference engines used to correlate historical EIS and battery event data to appropriate user recommendations in a battery use database and to use such a battery use database to identify a user recommendation appropriate in view of a received set of EIS data. The AI engine may determine correlations of the test waveform and the waveform result with historical test waveforms and waveform results stored in the battery use database. The result of the AI engine processing of such data may indicate whether there is a significant correlation (i.e., a correlation exceeding a correlation threshold) between the test waveform, the waveform result, the battery event and historical entries stored in the battery use database. For a significant correlation, with a significant number of similar entries exceeding the correlation threshold, the battery module may determine that the battery event is correct. When a correlation is determined to be not significant (i.e., with a correlation factor that is less than the correlation threshold) other non-preferred standard recommendations may be sent to the user. In some embodiments, the battery module may also send a paid user action recommendation (which may be previously paid for as a subscription fee or paid for as a per use fee). In some embodiments the battery module may send user action recommendations until a correct recommendation with sufficiently high correlation or number of similar entries (such as >5000 entries) is found. Optionally, the user action recommendations and thresholds may be selected from a manufacturer provided list of user action recommendations and thresholds. An artificial intelligence engine or neural network may predict a next battery event based on EIS test data, based on the result of multiple correlations using EIS test results from a plurality of test waveforms.

The method 1100 may be implemented in software executing in a software-configurable processor of a server of an EISA network. In order to encompass the alternative configurations enabled in various embodiments, the hardware implementing the method 1100 is referred to herein as an "EISA network server."

In block 1104, the EISA network server may poll an EISA system (e.g., EISA system 200a, 200b, 200c in FIG. 7) for results of EIS tests. In some embodiments, the EISA network server continually or periodically poll multiple EISA systems communicatively connected to an EISA network. In some embodiments, the EISA network server may specifically poll and/or may be responded to by a battery powered device of the EISA system. In some embodiments, block 1104 may not be performed or may be bypassed when the EISA system on or coupled to a battery-powered device sends EIS test results to the EISA network server without polling.

In block 1106, the EISA network server may receive from an EISA system EIS test results, such as in the form of a test waveform, a waveform result, and a battery event from an EIS test. For example, a battery data collection module may send the test waveform, the waveform result, and the battery event that prompted the EISA system to conduct the EIS test, such as discussed for block 812 of the method 800 described with reference to FIG. 8. In some embodiments, the EISA network may also receive identifying information for a source of the test waveform, the waveform result, and the battery event, including any combination of battery identifying information (e.g., type of battery), battery operated device identifying information, EISA system identifying information, user identifying information, and charger identifying information.

In block 1108, the EISA network server may store the test waveform, the waveform result, and the battery event in a battery use database. The test waveform, the waveform result, and the battery may be stored in a manner that associates the test waveform, the waveform result, and the battery with each other and/or with a user identifier, a battery powered device identifier, and/or an EISA system identifier.

In block 1110, the EISA network server may run an AI engine on the received EIS test results, such as running the AI engine on any combination of the test waveform, the waveform result, and the battery. The EISA network server may apply the AI engine on any combination of the test waveform, the waveform result, and the battery event along with all historical data stored for the same user and other users and/or same EISA system and other EISA systems with battery powered devices. The AI engine may determine correlations of the test waveform, the waveform result, and/or the battery event with historical test waveforms, waveform results, and/or battery events. The result of this analysis may indicate whether there is a correlation (i.e., having a correlation factor above a correlation threshold) with historical test waveforms, waveform results, and/or battery events. An example of running the learning algorithm is discussed further herein for the method 1200 described with reference to FIG. 12.

In block determination block 1112, the EISA network server may determine whether the test waveform, the waveform result, and/or the battery event are similar to the historical test waveforms, waveform results, and/or battery events stored to the battery use database. To determine similarity, the EISA network server may compare the values of the test waveform, the waveform result, and/or the battery event with the values of the historical test waveforms, waveform results, and/or battery events stored to the battery use database. Similarity of each of the values of the test waveform, the waveform result, and/or the battery event to the historical values of individual entries of the historical test waveforms, waveform results, and/or battery events may be determined for each type of value (i.e., test waveform and historical test waveform, waveform result and historical waveform result, and battery event and historical batter event). Similarity of the values of the test waveform, the waveform result, and/or the battery event to the historical values of individual entries of the historical test waveforms, waveform results, and/or battery events may be determined for a combination of values for each entry. A similarity may be derived by various known and proprietary means, which may include comparison of a comparison of a value and a historical value to a similarity threshold. A composite similarity of the similarities for each individual value in an entry in the battery use database may be derived by various known and proprietary means based on all of the values and/or a subset of the values determined to be similar. A similarity of the composite similarity of a historical entry may be determined by comparison of the composite similarity to an entry composite similarity threshold. A composite similarity of any number of entries in the battery use database may be derived by various known and proprietary means based on the number of entries and/or a subset of the number of entries determined to be similar. A similarity of the composite similarity of a number of historical entries may be determined by comparison of the composite similarity to an entries composite similarity threshold. Similarity of the test waveform, the waveform result, and/or the battery event with the values of the historical test waveforms, waveform results, and/or battery events may be determined in aggregate such that a number of the historical values determined to be similar may exceed an aggregate similarity threshold. In some embodiments, the operations in determination block 1112 may include identifying an historical EIS test results (or composite EIS test results) that has a highest degree of similarity (i.e., most similar). In some embodiments, the operations in determination block 1112 may include identifying all historical EIS test results (or composite EIS test results) with a degree of similarity exceeding the similarity threshold.

In some embodiments, the operations of blocks 1110 and 1112 may be combined or performed in a single operation or step. For example, AI processing of the received EIS test results may be performed to determine a degree of correlation of the results with historical test waveforms, waveform results, and/or battery events and a degree of similarity to a correlated result in a single or combine operation. As another example, AI processing of the received EIS test results may be performed to determine a degree of similarity to a particular set historical test waveforms, waveform results, and/or battery events that have been previously correlated into a classification or representative set stored in the battery use database (e.g., 726) without performing a separate correlation operation.

In response to determining that the received EIS test results (e.g., one or more of test waveform, the waveform result, and/or the battery event) are similar to one or more historical EIS test results (or composite results), such as one or more of historical test waveforms, waveform results, and/or battery events, (i.e., determination block 1112="Yes"), the EISA network server may send a user action recommendation corresponding to the similar historical EIS test result(s) to the battery data collection module in block 1114. An example of how the user action recommendation may be determined as discussed for the method 1200 described with reference to FIG. 12.

In response to deterring that the test waveform, the waveform result, and/or the battery event are not similar to any historical results (i.e., determination block 1112="No"), the EISA network server may not respond or may send a non-preferred recommendation to the battery data collection module in block 1116. An example of how the non-preferred recommendation may be determined as discussed for the method 1200 described with reference to FIG. 12.

Following sending the user action recommendation to the battery data collection module in block in block 1114; or following sending the non-preferred recommendation to the battery data collection module in block in block 1114, the EISA network server may recognize a next user, battery powered device, and/or EISA system. The EISA network server may select any other user, battery powered device, and/or EISA system, for example, from among users, battery powered devices, and/or EISA systems to which EIS test data has been sent as discussed herein in block 1006 of the method 1000 described with reference to FIG. 10.

In block 1104, the EISA network serve may poll an EISA system and/or battery powered device associated with the recognized user, EISA system, and/or battery powered device for results of EIS tests.

Figure 12:
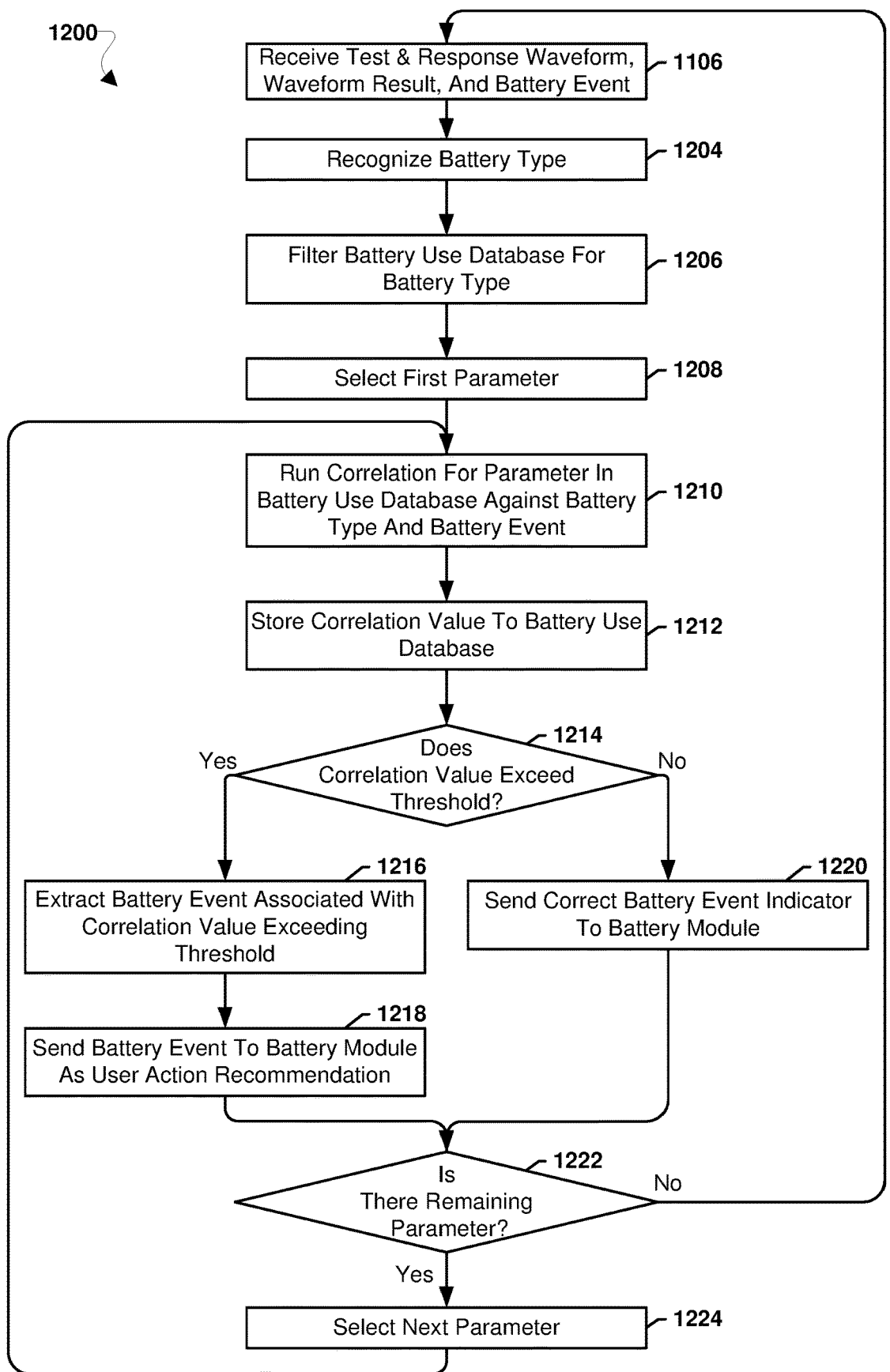
FIG. 12 is a process flow diagram illustrating a method for remote battery management according to an embodiment.

FIG. 12 illustrates a method 1200 for remote battery management for identifying correlations between EIS test data and battery events according to an embodiment. The method may be implemented in an EISA network server (e.g., server 1700 in FIG. 17), such as in a battery module (e.g., battery module 722 in FIG. 7) within the EISA network (e.g., EISA network 720 in FIG. 7). In some embodiments, the EISA network server may implement an AI engine to correlate EIS testing data and battery event data into a battery use database (e.g., battery use database 726 in FIG. 7) that can be used by the AI engine to determine appropriate user action recommendations based upon later received EIS test data. The EISA network server may receive EIS test data from a plurality of battery-powered device EISA systems. The EISA network battery module may recognize a battery type of a battery (e.g., battery 742 in FIG. 7), for example, by looking up the battery identifying information in the EIS test data received from a battery powered device user action database (e.g., user action database 748 in FIG. 7). The EISA network server may filter an EISA network battery use database (e.g., battery use database 726 in FIG. 7) for the same battery type. The EISA network server may select a specific parameter (e.g., a test waveform) from the battery use database and use the AI engine to perform correlations for all the parameter data that is associated with the battery type and specific parameter from the data in the battery use database. In response to identifying a correlation above a predetermined correlation threshold (e.g., 92%), the EISA network server may store the correlation percentage in the battery use database, extract a battery event from the battery use database, and send the battery event to the battery module as a user action recommendation. For any remaining parameters, the EISA network server may select a next parameter and perform correlations for all of the parameter data that has the same battery type and parameter. In response to determining that a correlation does not exceed the threshold, the EISA network server may store the correlation percentage in the battery use database and an indication that the battery event is correct may be sent to the battery module. For no remaining parameters, the EISA network server may return to waiting for more EIS test data for analysis.

The method 1200 may be implemented in software executing in a software-configurable processor of a server of an EISA network. In order to encompass the alternative configurations enabled in various embodiments, the hardware implementing the method 1200 is referred to herein as an "EISA network server."

In block 1106, the EISA network server may receive EIS test data from an EISA system, such as test and response waveforms, waveform results and battery events as described for the like numbered block of the method 1100 described with reference to FIG. 1100.

In block 1204, the EISA network server may recognize a battery type of a battery that is the source of the received EIS test data. The EISA network server may receive battery identifying information as part of the received EIS test data, as discussed herein for block 1002 of the method 1000 described with reference to FIG. 10 and/or for block 1106 of the method 1100 described with reference to FIG. 11. The EISA network server may extract the battery type from the received battery identifying information.

In block 1206, the EISA network server may filter a battery use database for entries including the battery type. The EISA network server may search for and retrieve entries from the battery use database using the battery type as the search and retrieval criterion.

In block 1208, the EISA network server may select a first parameter from the entries from the battery use database. The EISA network may select any parameters, such as test waveform, waveform result, and response waveform. For example, the first parameter selected may be the test waveform.

In block 1210, the EISA network server may execute the AI engine to determine a correlation for the values of the first parameter for the entries filtered from the battery use database based on battery type against the battery type and battery event for those entries. Continuing with the above example, the correlation may be executed for all of the values of the test waveform for the entries filtered from the battery use database based on battery type against the battery type and battery event for those entries. In some embodiments, the correlation value may be expressed in terms of a decimal, a fraction, a percentage, a ratio, etc.

In block 1212, the EISA network server may update the battery use database with the resulting correlation value, such as by storing the correlation value in conjunction with the EIS test data (or test data element) or with historical EIS test data (or test data elements). For example, the resulting correlation value may be stored in the battery use database in a manner that associates the correlation value to the test waveform, response wave and battery type received by the EISA network server from an EISA system. The resulting correlation value for each correlation may be stored to the battery use database in a manner associating the correlation value with the parameter value. In some embodiments, the correlation value may be stored in conjunction with or used to update (e.g., refine) a correlation value of EIS test data entry already stored in the battery use database.

In determination block 1214, the EISA network server may determine whether the correlation value exceeds a correlation threshold. The EISA network server may compare the correlation value to a predetermined, learned, and/or downloaded correlation threshold to determine whether the correlation value exceeds the correlation threshold.

In response to determining that the correlation value exceeds the correlation threshold (i.e., determination block 1214="Yes"), the EISA network server may extract a battery event from the entry in the battery use database storing the correlation value which exceeds the correlation threshold in block 1216. The EISA network server may search for the entry based on a criteria of any combination of the correlation value that exceeds the correlation threshold, the battery type, and/or the parameter value, and may extract the battery event from the returned entry from the battery use database.

In block 1218, the EISA network server may send the battery event to the battery module as a user action recommendation. The battery event uploaded to the EISA network server with the test waveform and the waveform result may indicate the battery event experienced by the battery that trigger an EIS test using the test waveform and producing the waveform result. In response to a correlation of the parameters associated with the battery event, the EISA network server may determine that the battery event is a problem and merits a user action recommendation to address the battery event.

In response to determining that the correlation value does not exceed the correlation threshold (i.e., determination block 1214="No"), the EISA network server may send an indicator that the battery event experienced by the battery is correct in block 1220. The battery event uploaded to the EISA network server with the test waveform and the waveform result may indicate the battery event experienced by the battery that trigger an EIS test using the test waveform and producing the waveform result. In response to no correlation of the parameters associated with battery event, the EISA network server may determine that the battery event is not a problem and does not require a user action recommendation to change the battery event.

Following sending the battery event to the battery module as a user action recommendation in block 1218; or sending an indicator that the battery event experienced by the battery is correct in block 1220, the EISA network server may determine whether there are more parameters process with the AI engine to determine correlations in determination block 1222. The EISA network server or the AI engine may keep track of which parameters have and have not been correlated.

In response to determining that there are no parameters remaining to be processed by the AI engine for correlation (i.e., determination block 1222="No"), the EISA network server may await receipt of more EIS test data in block 1106.

In response to determining that there are more parameters to be processed by the AI engine for correlation (i.e., determination block 1222="Yes"), the EISA network server may select a next parameter from the remaining parameters in block 1224 and again execute the AI engine to determine a correlation for the values of the next parameter for the entries filtered from the battery use database based on battery type against the battery type and battery event for those entries.

Figure 13B:
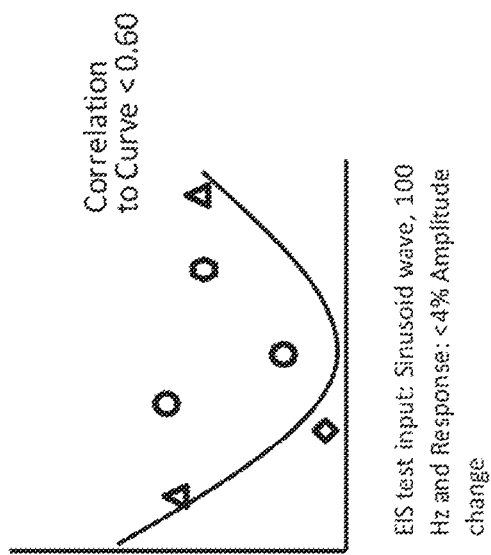
FIG. 13B is a graphical representation illustrating an example EIS test waveform and response waveform attribute that is poorly correlated to a user action.
Figure 13A:
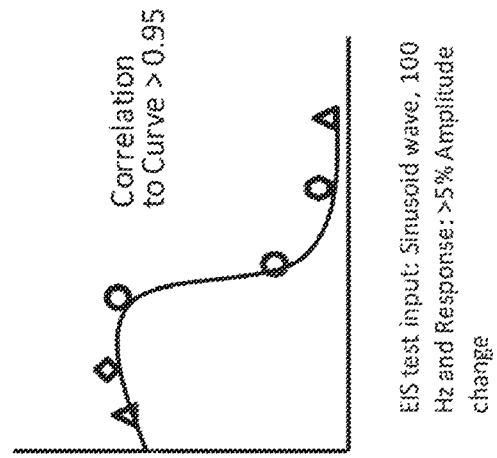
FIG. 13A is a graphical representation illustrating an example EIS test waveform and response waveform that is well correlated to a user action.

FIG. 13A illustrates an example EIS test input and EIS test response data, such as the EIS test waveform parameters and the digitized response waveform data, which may be well correlated to a user action recommendation, such as a battery replacement. The plotted points of the EIS test input and EIS test response data may closely follow a trend line of historical EIS test input and EIS test response data associated with the user action recommendation. A degree of closeness of the plotted points of the EIS test input and EIS test response data following the trend line of the historical EIS test input and EIS test response data associated with the user action recommendation may be indicated by a correlation coefficient. In the example illustrated in FIG. 13A, close correlation of the plotted points of the EIS test input and EIS test response data following the trend line of the historical EIS test input and EIS test response data associated with the user action recommendation may be indicated by a correlation coefficient greater than 0.95.

FIG. 13B illustrates EIS test input and EIS test response data that are poorly correlated to a user action recommendation, such as battery replacement. In the illustrated example, the plotted points of the EIS test input and EIS test response data do not closely follow a trend line of historical EIS test input and EIS test response data associated with the user action recommendation. In the example illustrated in FIG. 13B, a lack of correlation of the plotted points of the EIS test input and EIS test response data following the trend line of the historical EIS test input and EIS test response data associated with the user action recommendation may be indicated by a correlation coefficient less than 0.60.

Close correlation to a user action recommendation for EIS test attributes observed in real-time, as in the example in FIG. 13A, may indicate that an action should be taken to return battery performance to a preferable or desirable state, such as replacing the battery. Little to no correlation to a negative performance event for EIS test attributes observed in real-time, as in the example in FIG. 13B, may indicate that no action needs to be taken to improve battery performance.

FIG. 14 illustrates an example user action database 748, which may be stored to volatile and/or persistent memory of a battery powered device (e.g., battery powered device 744 in FIG. 7). Column one 1402 may store a user identifier. In some embodiments, the user action database may include other identifying information, including any combination of EISA system, battery, battery powered device, and charger identifying information. Column two 1404 may store EISA test waveforms that are applied to a battery of a battery powered device during EIS testing. Column three 1406 may store response waveforms obtained from a battery as a response to the EISA test waveform. Column four 1408 may store a waveform result, which may represent a characteristic of the response waveform reflected by the battery of the battery powered device and collected by the EIS system in relation to the EISA test waveform. Column five 1410 may store a battery event, which may represent an action that may be taken by a user of the battery powered device and/or a change in battery state. The battery events may have an impact on the battery life, such as charging the battery, battery charging stopped, battery replacement, downloaded software and/or firmware patch for battery management, charging the battery twice daily, etc.

FIG. 15 illustrates an example battery use database 726, which may be stored to volatile and/or persistent memory of an EISA network (e.g., EISA network 720 in FIG. 7). Column one 1502 may store a user identifier for a battery powered device that may be polled for EIS test results and battery events. In some embodiments, the user action database may include other identifying information, including any combination of EISA system, battery, battery powered device, and charger identifying information. Column two 1502 may store EISA test waveforms, also referred to as test waveforms, that may be conducted on a battery of a battery powered device. Column three 1506 may store response waveforms obtained from the battery as a response to the EISA test waveform. Column four 1508 may store waveform results, which may represent a characteristic of the response waveform reflected by the battery of the battery powered device and collected by the EIS system in relation to the EISA test waveform. Column five 1510 may store a battery event, which may represent an action that may be taken by a user of the battery powered device and/or a change in battery state that may be found to occur in a network of similar battery powered devices. Column six 1512 may store correlation coefficients derived by the artificial intelligence engine running on historically collected data in the EISA network battery use database. A high correlation may indicate that a user action recommendation implemented on other battery powered device may be able to increase a battery powered device's battery performance if the user action recommendation is implemented.

FIGS. 16A and 16B illustrate an example test database 708 and command database 706, respectively. The test database 708 and the command database 706 may be located on any combination of volatile and/or persistent memories of an EIS system (e.g., EIS system 702 in FIG. 7). These databases 706, 708 may contain portions of information stored in an EISA network battery use database (e.g., battery use database 726 in FIG. 7). Portions of the information stored in the test database 708 and the command database 706 may be acquired from an EISA network EIS test data database (e.g., EIS test data database 728 in FIG. 7) via an EIS system (e.g., EIS system 702 in FIG. 7) through an EISA network base module (e.g., base module 724 in FIG. 7).

In FIG. 16A, the test database 708 may store EIS test waveform data for performing EIS tests on batteries (e.g., battery 742 in FIG. 7) connected to the EIS system to test the battery state and to keep it within normal operating levels to prevent any hazardous events. Column one 1602 may store a battery type and column two 1604 may store a battery identifier. Column three 1606 may store parameters that may be downloaded by a communication module (e.g., comms module 704 in FIG. 7) of the EIS system from the EISA network EIS test data database via the base module. Column four 1608 may store an output or response waveform in digital data file format that may be generated by passing the response waveform obtained from the EIS battery tester circuit (e.g., battery tester circuit 716 in FIG. 7) and through an analog-to-digital converter (e.g., analog-to-digital converter 714 in FIG. 7).

In FIG. 16B, the command database 706 may store EIS commands that may be sent to the battery tester circuit for conducting an EIS test. Column one 1612 and column two 1614 may store a battery type and a battery identifier. Column three 1616 may store the EIS test commands, such as when and for how long test signals may be applied to the battery, and when and how long output signals from the battery may be measured. There may be other forms of instructions possible that may be stored in the command database 706

Figure 17:
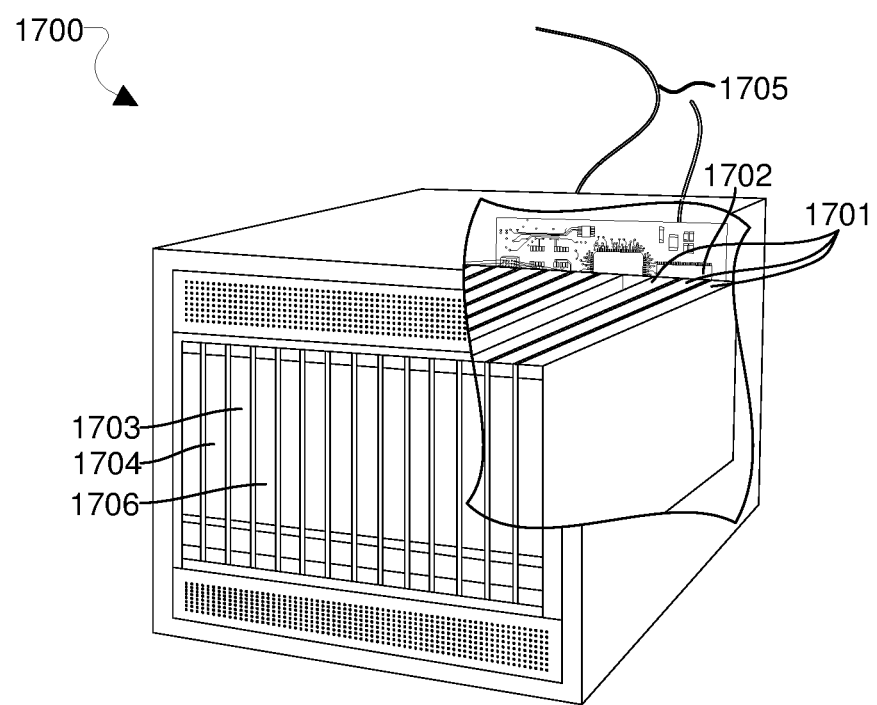
FIG. 17 is a component block diagram of server suitable for use with the various embodiments.

The EIS system test database 708 and the EISA network 720 may be implemented on any of a variety of commercially available computing devices, such as a server 1700 as illustrated in FIG. 17. Such a server 1700 typically includes a processor 1701 coupled to volatile memory 1702 and a large capacity nonvolatile memory, such as a disk drive 1703. The server 1700 may also include a floppy disc drive, compact disc (CD) or DVD disc drive 1704 coupled to the processor 1701. The server 1700 may also include network access ports 1706 coupled to the processor 1701 for establishing data connections with a network 1705, such as a local area network coupled to other operator network computers and servers.

With reference to FIGS. 1-17, some embodiments of the present disclosure include methods for local battery management, comprising: receiving, by a battery powered device (744), a test waveform used in performing an EIS test on a battery (742) of the battery powered device and a response waveform resulting from the EIS test from an EIS system (702); determining whether there a battery event is occurring or has occurred; receiving, by the battery powered device, a user action recommendation from an EISA network (720) in response to determining that a battery event is occurring or has occurred; and displaying the user action recommendation in a graphical user interface (746) of the battery powered device. Some embodiment methods may further comprise: receiving, by the battery powered device, a waveform result based on an analysis of the test waveform and the response waveform from the EIS system; and sending, by the battery powered device, the test waveform, the waveform result, and the battery event to the EISA network in response to determining that a battery event is occurring or has occurred. Some embodiment methods may further comprise storing the test waveform, the response waveform, the waveform result, and the battery event in an associated manner in the battery powered device.

In some embodiment methods, determining whether a battery event is occurring or has occurred may comprise monitoring the battery for a change in a battery state. In some embodiment methods, determining whether a battery event is occurring or has occurred may comprise monitoring the battery powered user device for a user interaction that causes a change in a battery state. Some embodiment methods may further comprise instructing the EIS system to perform the EIS test by the battery operated device.

With reference to FIGS. 1-17, some embodiments of the present disclosure include a battery powered device (744) electrically connectable to a battery (722) and comprising: a display (746); and a control device (710, 712, 730) communicatively connectable to an EIS system (702), communicatively connectable to an EISA network (720), and configured with executable instructions to: receive a test waveform used in performing an EIS test on the battery and a response waveform resulting from the EIS test from the EIS system; determine whether there is a battery event is occurring or has occurred; receive a user action recommendation from the EISA network in response to determining that a battery event is occurring or has occurred; displaying the user action recommendation in a graphical user interface on the display (746).

In some embodiments, the control device may be further configured with executable instructions to: receive a waveform result based on an analysis of the test waveform and the response waveform from the EIS system; and send the test waveform, the waveform result, and the battery event to the EISA network in response to determining that a battery event is occurring or has occurred. In some embodiments, the control device may be communicatively connected to a memory (706, 708, 734) and may be further configured with executable instructions to store the test waveform, the response waveform, the waveform result, and the battery event in an associated manner in the memory. In some embodiments, the control device may be further configured with executable instructions to determine whether a battery event is occurring or has occurred by monitoring the battery for a change in a battery state. In some embodiments, the control device may be further configured with executable instructions to determine whether a battery event is occurring or has occurred by monitoring the battery powered user device for a user interaction that causes a change in a battery state. In some embodiments, the control device may be further configured with executable instructions to instruct the EIS system to perform the EIS test. In some embodiments, the EIS system may be integral to the battery powered device.

With reference to FIGS. 1-17, some embodiments of the present disclosure include methods performed in an EISA network server (720, 722, 724, 1700) for remote battery management, comprising: receiving EIS test results from an EIS test performed by a battery powered device, the received EIS test results including a test waveform, a waveform result, and a detected battery event that prompted the EIS test; determining a degree of similarity between the received EIS test results and historical EIS test results; identifying a user recommendation corresponding to an historical EIS test result determined to have a degree of similarity to the received EIS test results exceeding a similarity threshold; and sending the identified user action recommendation to the battery powered device (744). In some embodiment methods, determining the degree of similarity between the received EIS test results and historical EIS test results comprises: determining a degree of similarity between any of the test waveform, the waveform result, and the battery event in the test results and test waveforms, result waveforms and battery events in a battery use database of historical EIS test results and battery events. In some embodiment methods, identifying a user recommendation corresponding to an historical EIS test result determined to have a degree of similarity to the received EIS test results exceeding a similarity threshold comprises obtaining the user recommendation from the battery use database entry or entries of historical EIS test results having a degree of similarity to the received EIS test results exceeding the similarity threshold.

Some embodiment methods further comprise determining a degree of correlation between the received EIS test results and historical EIS test results, wherein determining the degree of similarity between the received EIS test results and historical EIS test results comprises determining the degree of similarity of the received EIS test results to historical EIS test results having a correlation to the received EIS test results that exceeds a correlation threshold.

In some embodiment methods, determining the degree of similarity between the received EIS test results and historical EIS test results comprises determining a degree of correlation between the received EIS test results and one or more historical EIS test results stored in a battery use database. In some embodiment methods, identifying a user recommendation corresponding to an historical EIS test result determined to have a degree of similarity to the received EIS test results exceeding a similarity threshold comprises: identifying one or more historical EIS test results correlated to the EIS test results with a correlation factor exceeding a correlation threshold; and obtaining the user recommendation from the battery use database entry or entries of historical EIS test results correlated to the EIS test results with a correlation factor exceeding the correlation threshold. Some embodiment methods further comprise updating the battery use database with the determined degree of correlation. In some embodiment methods, determining a degree of correlation between the received EIS test results and one or more historical EIS test results stored in a battery use database comprises: determining a degree of correlation between each of the test waveform, the response waveform result, and the battery event of the received EIS test results and historical test waveforms, the historical waveform results, and the historical battery events, respectively; and determining whether the degree of correlation between each of the test waveform, the response waveform result, and the battery event of the received EIS test results and historical test waveforms, the historical waveform results, and the historical battery events, respectively exceeds the correlation threshold; and updating the battery use database with the determined degree of correlation comprises updating the battery use database with the determined degree of correlation for each of the test waveform, the response waveform result, and the battery event. Some embodiment methods further comprise sending an indicator that a user action is correct in response to determining that no correlation value exceeds the correlation threshold.

With reference to FIGS. 1-17, some embodiments of the present disclosure include an EISA network server (720, 722, 724, 1700) coupled to a network (740) and configured with server executable instructions to cause the server to perform operations comprising: receiving EIS test results from an EIS test performed on a battery 742) by a battery powered device (744), the received EIS test results including a test waveform, a waveform result, and a detected battery event that prompted the EIS test; determining a degree of similarity between the received EIS test results and historical EIS test results; identifying a user recommendation corresponding to an historical EIS test result determined to have a degree of similarity to the received EIS test results exceeding a similarity threshold; and sending the identified user action recommendation to the battery powered device. In some embodiments, the server is further configured with server executable instructions to cause the server to perform operations such that determining the degree of similarity between the received EIS test results and historical EIS test results comprises: determining a degree of similarity between any of the test waveform, the waveform result, and the battery event in the test results and test waveforms, result waveforms and battery events in a battery use database of historical EIS test results and battery events. In some embodiments, the server is further configured with server executable instructions to cause the server to perform operations such that identifying a user recommendation corresponding to an historical EIS test result determined to have a degree of similarity to the received EIS test results exceeding a similarity threshold comprises obtaining the user recommendation from the battery use database entry or entries of historical EIS test results having a degree of similarity to the received EIS test results exceeding the similarity threshold. In some embodiments, the server is configured with server executable instructions to cause the server to perform operations further comprising determining a degree of correlation between the received EIS test results and historical EIS test results, and the server is further configured with server executable instructions to cause the server to perform operations such that determining the degree of similarity between the received EIS test results and historical EIS test results comprises determining the degree of similarity of the received EIS test results to historical EIS test results having a correlation to the received EIS test results that exceeds a correlation threshold.

In some embodiments, the server is further configured with server executable instructions to cause the server to perform operations such that determining the degree of similarity between the received EIS test results and historical EIS test results comprises determining a degree of correlation between the received EIS test results and one or more historical EIS test results stored in a battery use database. In some embodiments, the server is further configured with server executable instructions to cause the server to perform operations such that identifying a user recommendation corresponding to an historical EIS test result determined to have a degree of similarity to the received EIS test results exceeding a similarity threshold comprises: identifying one or more historical EIS test results correlated to the EIS test results with a correlation factor exceeding a correlation threshold; and obtaining the user recommendation from the battery use database entry or entries of historical EIS test results correlated to the EIS test results with a correlation factor exceeding the correlation threshold. In some embodiments, the server is further configured with server executable instructions to cause the server to perform operations further comprising updating the battery use database with the determined degree of correlation. In some embodiments, the server is further configured with server executable instructions to cause the server to perform operations such that: determining a degree of correlation between the received EIS test results and one or more historical EIS test results stored in a battery use database comprises: determining a degree of correlation between each of the test waveform, the response waveform result, and the battery event of the received EIS test results and historical test waveforms, the historical waveform results, and the historical battery events, respectively; and determining whether the degree of correlation between each of the test waveform, the response waveform result, and the battery event of the received EIS test results and historical test waveforms, the historical waveform results, and the historical battery events, respectively exceeds the correlation threshold; and updating the battery use database with the determined degree of correlation comprises updating the battery use database with the determined degree of correlation for each of the test waveform, the response waveform result, and the battery event. In some embodiments, the server is further configured with server executable instructions to cause the server to perform operations further comprising sending an indicator that a user action is correct in response to determining that no correlation value exceeds the correlation threshold.

The foregoing method descriptions and diagrams are provided merely as illustrative examples and are not intended to require or imply that the steps of the various embodiments must be performed in the order presented. As will be appreciated by one of skill in the art the order of steps in the foregoing embodiments may be performed in any order. Further, words such as "thereafter," "then," "next," etc. are not intended to limit the order of the steps; these words are simply used to guide the reader through the description of the methods.

One or more diagrams have been used to describe exemplary embodiments. The use of diagrams is not meant to be limiting with respect to the order of operations performed. The foregoing description of exemplary embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

Control elements may be implemented using computing devices (such as computer) comprising processors, memory and other components that have been programmed with instructions to perform specific functions or may be implemented in processors designed to perform the specified functions. A processor may be any programmable microprocessor, microcomputer or multiple processor chip or chips that can be configured by software instructions (applications) to perform a variety of functions, including the functions of the various embodiments described herein. In some computing devices, multiple processors may be provided. Typically, software applications may be stored in the internal memory before they are accessed and loaded into the processor. In some computing devices, the processor may include internal memory sufficient to store the application software instructions.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

The preceding description of the disclosed embodiments is provided to enable any person skilled in the art to make or use the described embodiment. Various modifications to these embodiments will be readily apparent to those skilled in the art, and the generic principles defined herein may be applied to other embodiments without departing from the scope of the disclosure. Thus, the present invention is not intended to be limited to the embodiments shown herein but is to be accorded the widest scope consistent with the following claims and the principles and novel features disclosed herein.

What is claimed is:

1. A method for local battery management, comprising:
receiving, by a battery powered device, a test waveform used in performing an electrochemical impedance spectroscopy (EIS) test on a battery of the battery powered device and a response waveform resulting from the EIS test from an EIS system;
determining whether a battery event is occurring or has occurred;
receiving, by the battery powered device, a user action recommendation configured to inform a user of a recommendation of an action to take regarding the battery from an electrochemical impedance spectroscopy analyzer (EISA) network via a communication connection in response to determining that a battery event is occurring or has occurred; and
displaying the user action recommendation in a graphical user interface (GUI) of the battery powered device.

2. The method of claim 1, further comprising:
receiving, by the battery powered device, a waveform result based on an analysis of the test waveform and the response waveform from the EIS system; and
sending, by the battery powered device, the test waveform, the waveform result, and the battery event to the EISA network in response to determining that a battery event is occurring or has occurred.

3. The method of claim 2, further comprising storing the test waveform, the response waveform, the waveform result, and the battery event in an associated manner in the battery powered device.

4. The method of claim 1, wherein determining whether a battery event is occurring or has occurred comprises monitoring the battery for a change in a battery state.

5. The method of claim 1, wherein determining whether a battery event is occurring or has occurred comprises monitoring the battery powered user device for a user interaction that causes a change in a battery state.

6. The method of claim 1, further comprising instructing the EIS system to perform the EIS test by the battery powered device.

7. A battery powered device electrically connectable to a battery and comprising:
a display; and a control device communicatively connectable to an electrochemical impedance spectroscopy (EIS) system, communicatively connectable to an electrochemical impedance spectroscopy analyzer (EISA) network via a communication network, and configured with executable instructions to:
receive a test waveform used in performing an EIS test on the battery and a response waveform resulting from the EIS test from the EIS system;
determine whether a battery event is occurring or has occurred;
receive a user action recommendation configured to inform a user of a recommendation of an action to take regarding the battery from the EISA network in response to determining that a battery event is occurring or has occurred;
displaying the user action recommendation in a graphical user interface (GUI) on the display.

8. The battery powered device of claim 7, wherein the control device is further configured with executable instructions to:
receive a waveform result based on an analysis of the test waveform and the response waveform from the EIS system; and
send the test waveform, the waveform result, and the battery event to the EISA network in response to determining that a battery event is occurring or has occurred.

9. The battery powered device of claim 8, wherein the control device is communicatively connected to a memory and is further configured with executable instructions to store the test waveform, the response waveform, the waveform result, and the battery event in an associated manner in the memory.

10. The battery powered device of claim 7, wherein the control device is further configured with executable instructions to determine whether a battery event is occurring or has occurred by monitoring the battery for a change in a battery state.

11. The battery powered device of claim 7, wherein the control device is further configured with executable instructions to determine whether a battery event is occurring or has occurred by monitoring the battery powered user device for a user interaction that causes a change in a battery state.

12. The battery powered device of claim 7, wherein the control device is further configured with executable instructions to instruct the EIS system to perform the EIS test.

13. The battery powered device of claim 7, wherein the EIS system is integral to the battery powered device.

14. A method for remote battery management, comprising:
receiving electrochemical impedance spectroscopy (EIS) test results from an EIS test performed by a battery powered device, the received EIS test results including a test waveform, a waveform result, and a detected battery event that prompted the EIS test;
determining a degree of similarity between the received EIS test results and historical EIS test results, wherein determining the degree of similarity between the received EIS test results and historical EIS test results comprises determining a degree of similarity between any of the test waveform, the waveform result, and the battery event in the test results and test waveforms, result waveforms and battery events in a battery use database of historical EIS test results and battery events;
identifying a user action recommendation corresponding to an historical EIS test result determined to have a degree of similarity to the received EIS test results exceeding a similarity threshold, wherein identifying a user action recommendation corresponding to an historical EIS test result determined to have a degree of similarity to the received EIS test results exceeding a similarity threshold comprises obtaining the user action recommendation from the battery use database entry or entries of historical EIS test results having a degree of similarity to the received EIS test results exceeding the similarity threshold; and
sending the identified user action recommendation to the battery powered device.

15. The method of claim 14, further comprising determining a degree of correlation between the received EIS test results and historical EIS test results,
wherein determining the degree of similarity between the received EIS test results and historical EIS test results comprises determining the degree of similarity of the received EIS test results to historical EIS test results having a correlation to the received EIS test results that exceeds a correlation threshold.

16. The method of claim 14, wherein determining the degree of similarity between the received EIS test results and historical EIS test results comprises determining a degree of correlation between the received EIS test results and one or more historical EIS test results stored in a battery use database.

17. The method of claim 16, wherein identifying a user action recommendation corresponding to an historical EIS test result determined to have a degree of similarity to the received EIS test results exceeding a similarity threshold comprises:
identifying one or more historical EIS test results correlated to the EIS test results with a correlation factor exceeding a correlation threshold; and
obtaining the user action recommendation from the battery use database entry or entries of historical EIS test results correlated to the EIS test results with a correlation factor exceeding the correlation threshold.

18. The method of claim 17, further comprising updating the battery use database with the determined degree of correlation.

* * * * *